United States Patent
Van Pelt et al.

(10) Patent No.: US 9,888,607 B2
(45) Date of Patent: Feb. 6, 2018

(54) SELF-BIASING STORAGE DEVICE SLED

(71) Applicant: Dot Hill Systems Corporation, Longmont, CO (US)

(72) Inventors: Kevin Lee Van Pelt, Longmont, CO (US); Christopher Ellis Schroeder, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 196 days.

(21) Appl. No.: 14/871,282

(22) Filed: Sep. 30, 2015

(65) Prior Publication Data
US 2017/0094828 A1    Mar. 30, 2017

(51) Int. Cl.
| | | |
|---|---|---|
| G06F 1/16 | (2006.01) |
| H05K 5/00 | (2006.01) |
| H05K 7/00 | (2006.01) |
| H05K 7/14 | (2006.01) |
| H05K 7/18 | (2006.01) |

(52) U.S. Cl.
CPC ............ H05K 7/1489 (2013.01); H05K 7/18 (2013.01)

(58) Field of Classification Search
CPC ............ G06F 1/18; G06F 1/183; G06F 1/187
USPC ............ 248/220.21, 220.22, 221.11, 222.12, 248/222.51, 223.41, 224.8, 225.11; 361/679.31, 679.37, 679.33, 679.38, 361/679.39, 724–727; 312/223.2
See application file for complete search history.

(56) References Cited

U.S. PATENT DOCUMENTS

| | | | |
|---|---|---|---|
| 5,166,918 A | 11/1992 | Kamijo | |
| 5,602,717 A | 2/1997 | Leshem et al. | |
| 6,067,225 A * | 5/2000 | Reznikov | G11B 33/122 |
| | | | 312/223.2 |
| 6,333,848 B1 | 12/2001 | Aida et al. | |
| 6,639,883 B1 | 10/2003 | Vladimir | |
| 6,697,225 B2 | 2/2004 | Wittig et al. | |
| 7,259,966 B2 | 8/2007 | Connelly, Jr. et al. | |
| 7,328,121 B1 | 2/2008 | Leigh | |
| 7,492,586 B2 * | 2/2009 | Peng | G11B 33/124 |
| | | | 248/694 |
| 7,538,974 B2 | 5/2009 | Wu | |
| 7,551,400 B2 | 6/2009 | Renken et al. | |
| 7,660,107 B2 | 2/2010 | Leung | |
| 7,679,856 B2 | 3/2010 | Ishiguro | |
| 7,684,181 B2 * | 3/2010 | Peng | G11B 33/123 |
| | | | 312/333 |
| 7,719,829 B2 | 5/2010 | Li | |

(Continued)

*Primary Examiner* — Terrell McKinnon
*Assistant Examiner* — Michael McDuffie
(74) *Attorney, Agent, or Firm* — Thomas J. Lavan

(57) ABSTRACT

A self-biasing storage device sled for mounting a storage device within a chassis is provided. The self-biasing storage device sled includes a bezel, which includes a first portion that is stationary relative to a storage device, a second portion vertically captured within the first portion and configured to slide between unlatching and latching positions, and a spring configured to push the latch outwardly from the bezel. The second portion includes a finger-movable member, a latch, and a horizontal biasing feature adjacent to the latch and configured to move in concert with the latch. When the storage device is installed in the chassis, the horizontal biasing feature exerts force against a first chassis interior side surface and biases the storage device sled against a second chassis interior side surface.

11 Claims, 28 Drawing Sheets

Exploded view of improved mounted storage device of first embodiment

(56) References Cited

U.S. PATENT DOCUMENTS

| | | | |
|---|---|---|---|
| 7,835,148 B2 * | 11/2010 | Tu | G06F 1/187 206/701 |
| 7,880,994 B2 | 2/2011 | Sato | |
| 7,948,849 B2 | 5/2011 | Chen | |
| 8,023,263 B2 * | 9/2011 | Crippen | G06F 1/187 312/223.1 |
| 8,070,125 B2 * | 12/2011 | Sun | G11B 33/08 248/225.11 |
| 8,117,628 B2 | 2/2012 | Wu | |
| 8,118,271 B2 * | 2/2012 | Peng | G06F 1/187 248/221.11 |
| 8,213,174 B1 | 7/2012 | Kapahi et al. | |
| 8,259,441 B2 * | 9/2012 | Chuang | G06F 1/187 361/679.31 |
| 8,271,140 B2 | 9/2012 | Cagno et al. | |
| 8,300,398 B2 * | 10/2012 | Zhang | G06F 1/187 312/223.2 |
| 8,385,076 B2 * | 2/2013 | Peng | G11B 33/124 248/200 |
| 8,432,680 B2 | 4/2013 | Peng et al. | |
| 8,456,832 B1 * | 6/2013 | Brigham, Jr. | G06F 1/187 361/679.33 |
| 8,644,015 B2 * | 2/2014 | Lin | G06F 1/187 248/274.1 |
| 8,681,440 B1 | 3/2014 | Theimer et al. | |
| 8,700,219 B2 | 4/2014 | Cagno et al. | |
| 8,724,248 B2 | 5/2014 | Dhanda et al. | |
| 8,794,073 B2 | 8/2014 | Kasai et al. | |
| 8,810,945 B2 | 8/2014 | Makino | |
| 8,976,472 B1 | 3/2015 | Theimer et al. | |
| 9,042,104 B2 * | 5/2015 | Tsai | G06F 1/187 174/542 |
| 9,111,563 B2 | 8/2015 | Lantz et al. | |
| 9,111,575 B1 | 8/2015 | Zhou et al. | |
| 2002/0141114 A1 | 10/2002 | Wittig et al. | |
| 2003/0099094 A1 * | 5/2003 | Coles | H05K 7/1409 361/726 |
| 2005/0157427 A1 | 7/2005 | Renken et al. | |
| 2006/0044748 A1 | 3/2006 | Connelly et al. | |
| 2007/0098281 A1 | 5/2007 | Fujie et al. | |
| 2007/0169130 A1 | 7/2007 | Wu | |
| 2008/0071393 A1 | 3/2008 | Cagno et al. | |
| 2008/0225428 A1 | 9/2008 | Ishiguro | |
| 2008/0266780 A1 * | 10/2008 | Olesiewicz | H05K 7/1421 361/679.33 |
| 2009/0040709 A1 | 2/2009 | Li | |
| 2009/0135556 A1 | 5/2009 | Leung | |
| 2009/0138900 A1 | 5/2009 | Wu | |
| 2009/0201605 A1 | 8/2009 | Lin | |
| 2009/0207720 A1 | 8/2009 | Lin | |
| 2010/0002557 A1 | 1/2010 | Chen | |
| 2011/0001409 A1 | 1/2011 | Peng et al. | |
| 2011/0051581 A1 | 3/2011 | Janik et al. | |
| 2012/0137780 A1 | 6/2012 | Kasai et al. | |
| 2012/0162893 A1 * | 6/2012 | Lin | G06F 1/187 361/679.31 |
| 2012/0300384 A1 * | 11/2012 | Alo | G06F 1/187 361/679.31 |
| 2013/0015317 A1 | 1/2013 | Huang et al. | |
| 2013/0033784 A1 | 2/2013 | Cagno et al. | |
| 2014/0142871 A1 | 5/2014 | Lombriser et al. | |
| 2015/0049399 A1 | 2/2015 | Lantz et al. | |
| 2015/0179211 A1 | 6/2015 | Theimer et al. | |
| 2015/0268703 A1 * | 9/2015 | Tu | G06F 1/187 361/679.38 |
| 2015/0310883 A1 | 10/2015 | Lantz et al. | |
| 2015/0331637 A1 | 11/2015 | Aguilar et al. | |

\* cited by examiner

Fig. 1 Data storage network
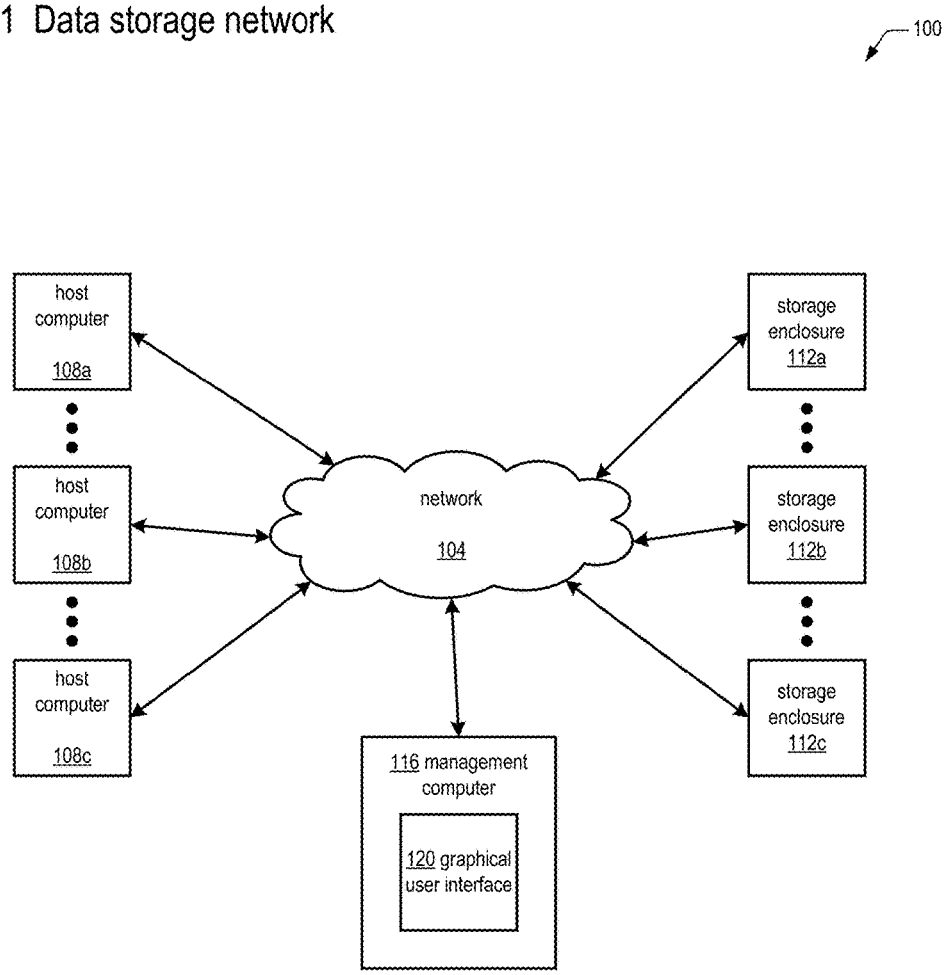

Fig. 2a  Host-based or expansion data storage system
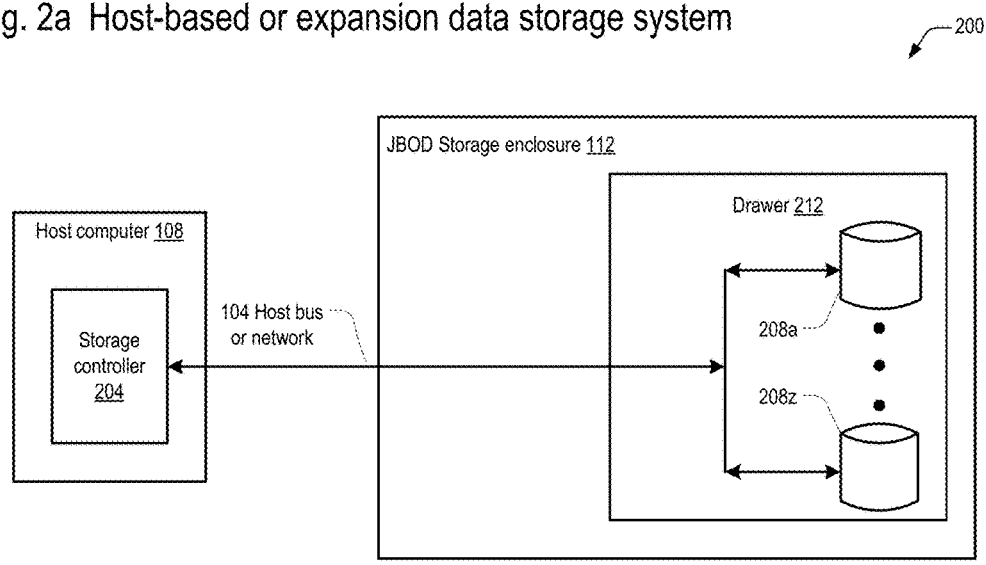
Fig. 2b  Non host-based data storage system
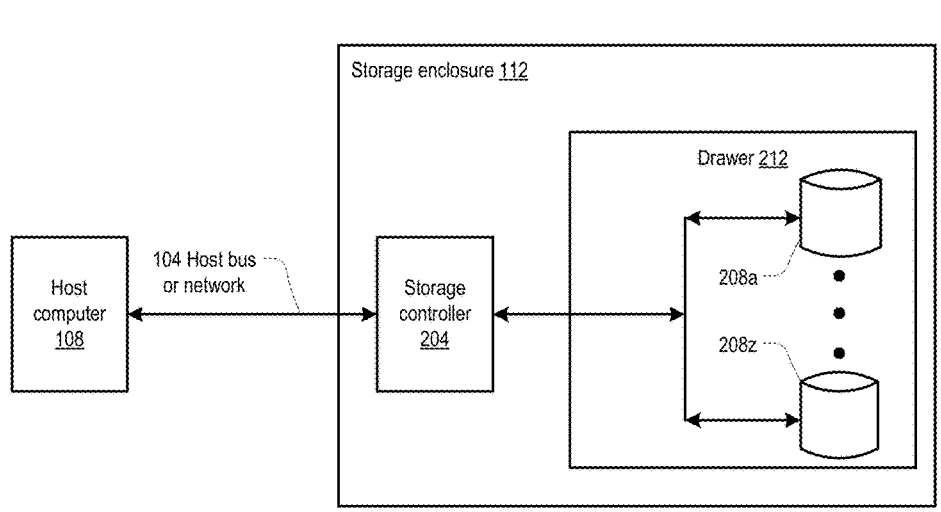

Fig. 3a  Storage enclosure of first embodiment with drawer extended
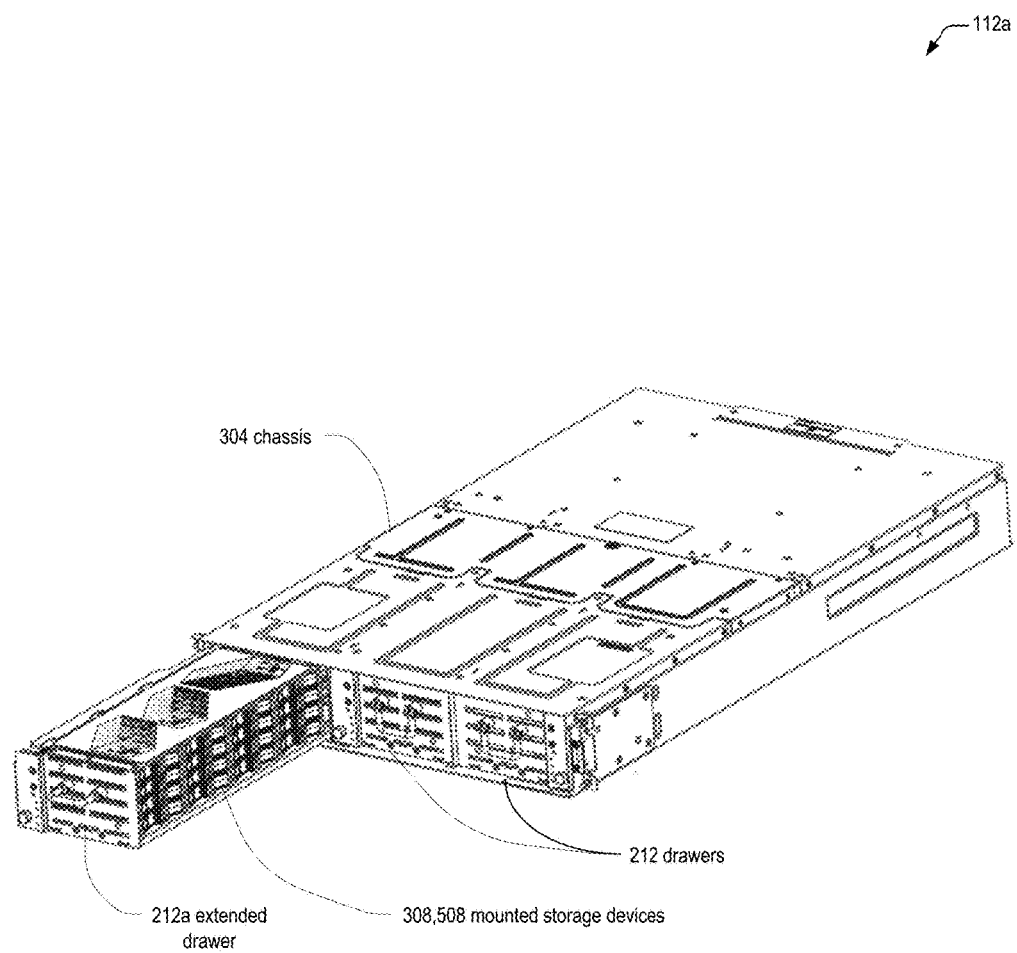

Fig. 3b Storage device mounting in a drawer
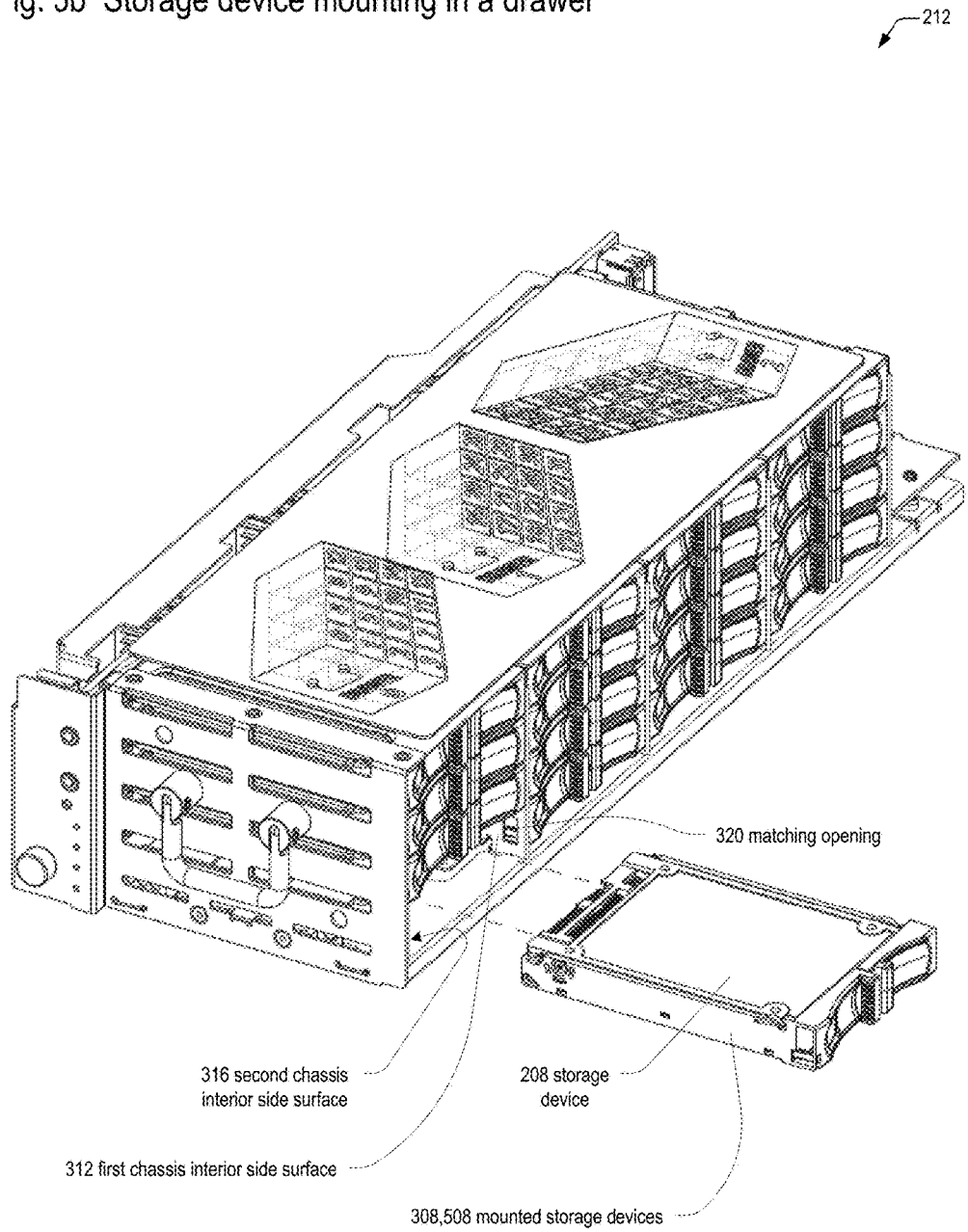

Fig. 3c  Conventional mounted storage device of first embodiment
Prior Art
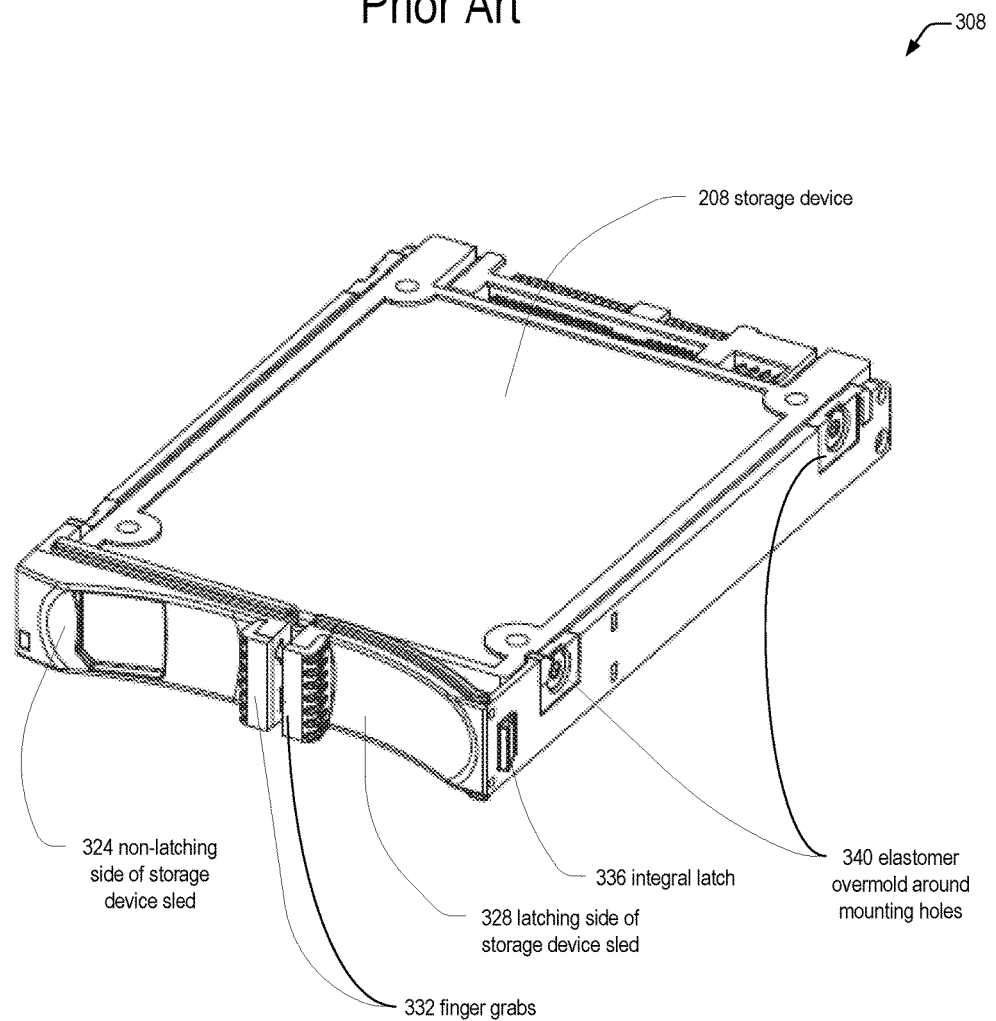

Fig. 3d Exploded view of conventional mounted storage device of first embodiment
Prior Art
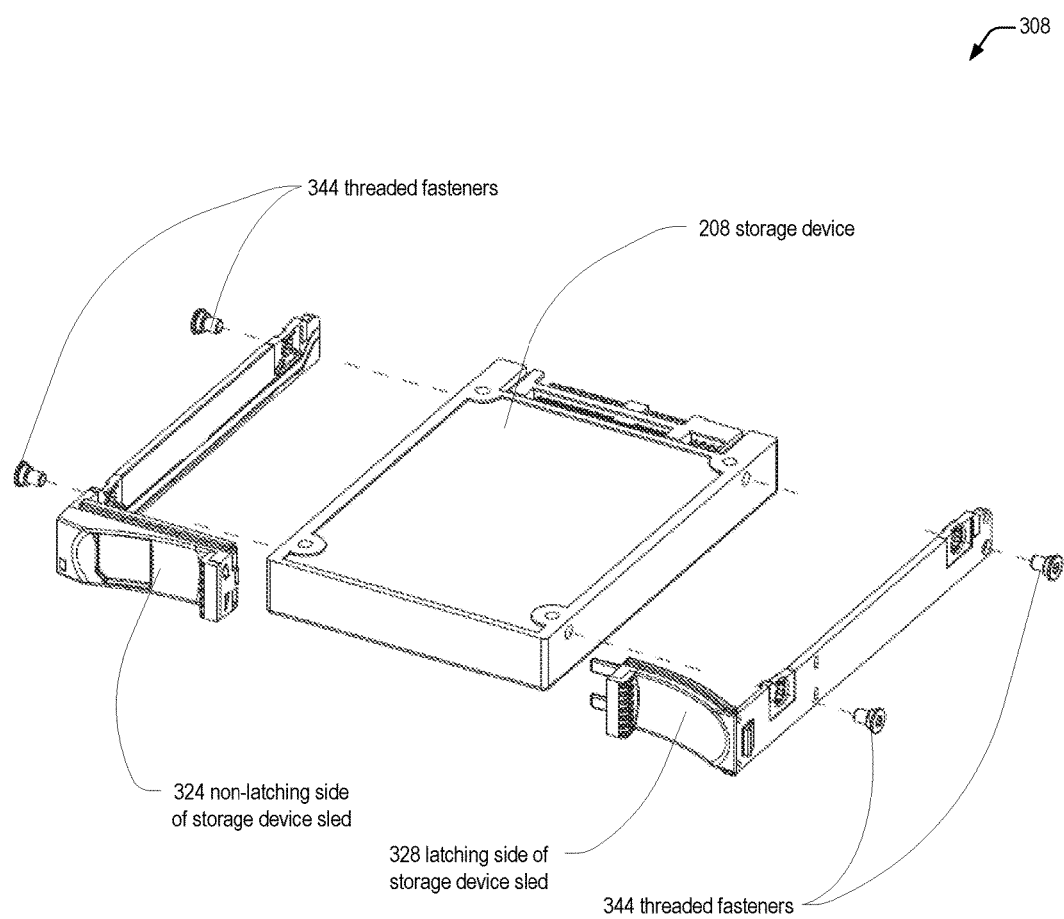

Fig. 4a  Storage enclosure of second embodiment with mounted storage device removed
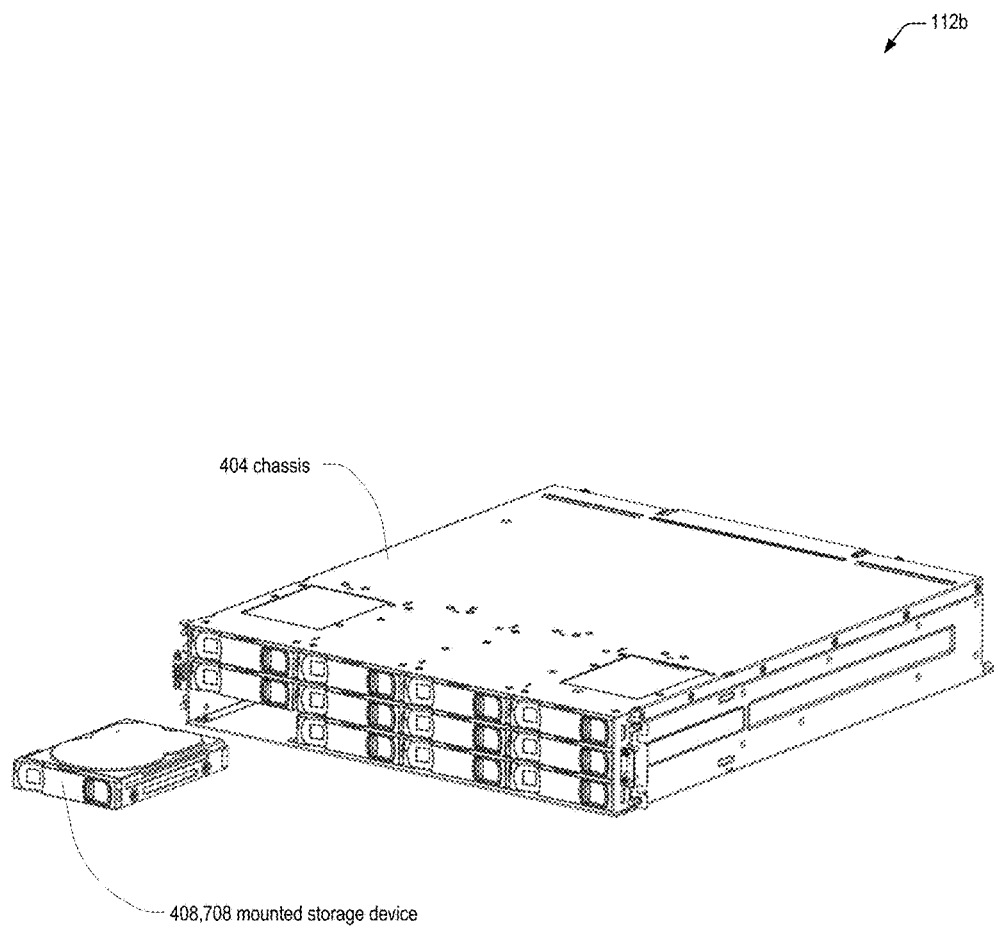

Fig. 4b Conventional mounted storage device of second embodiment
Prior Art
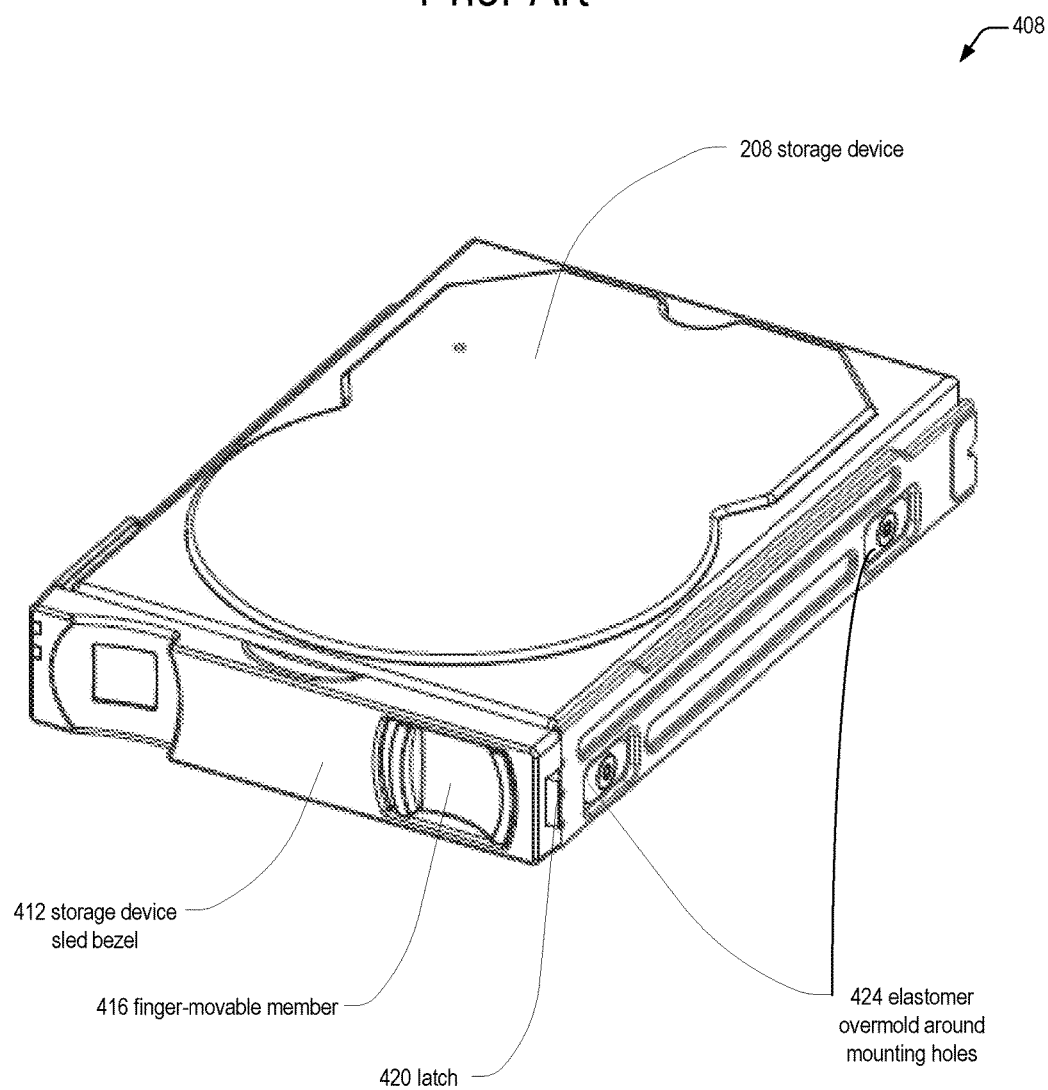

Fig. 4c  Exploded view of conventional mounted storage device of second embodiment
Prior Art
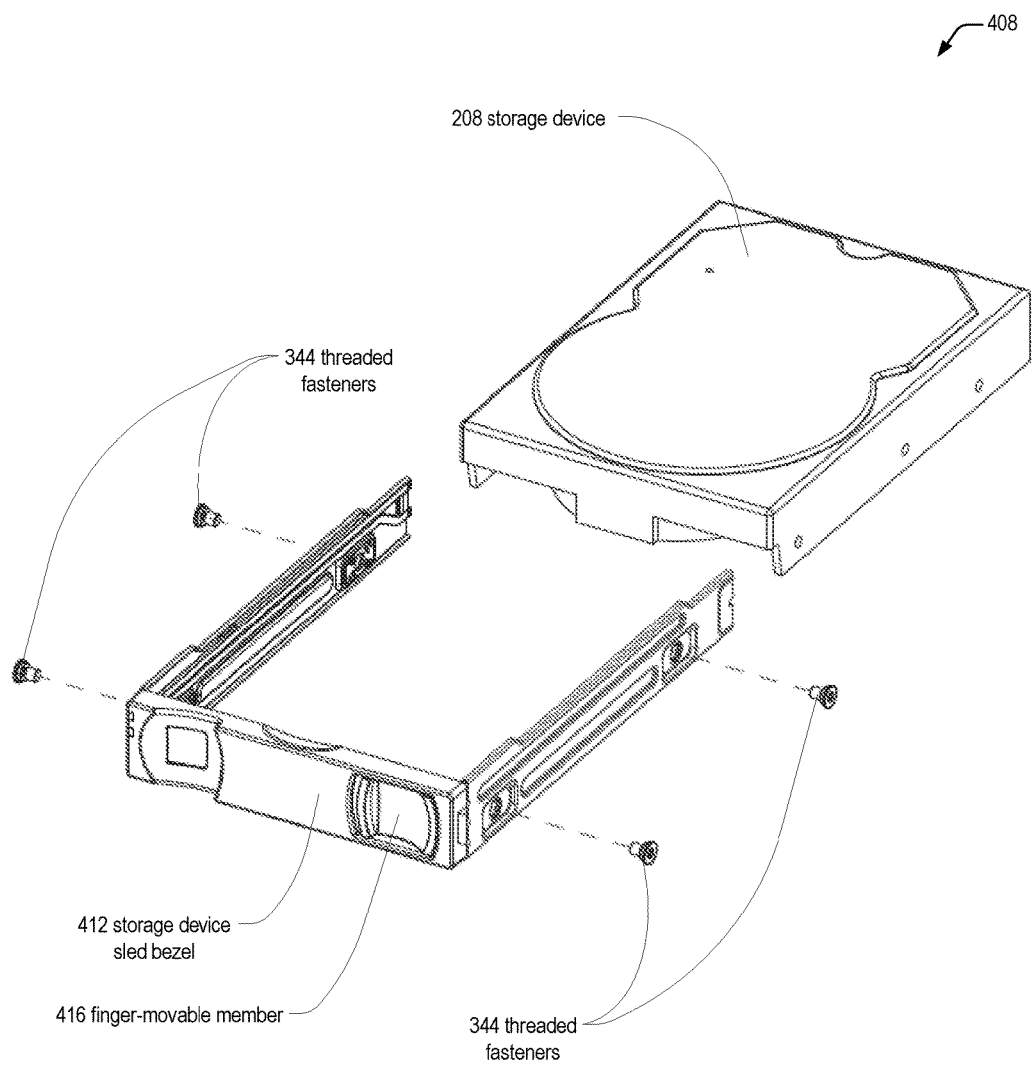

Fig. 5a Improved mounted storage device of first embodiment
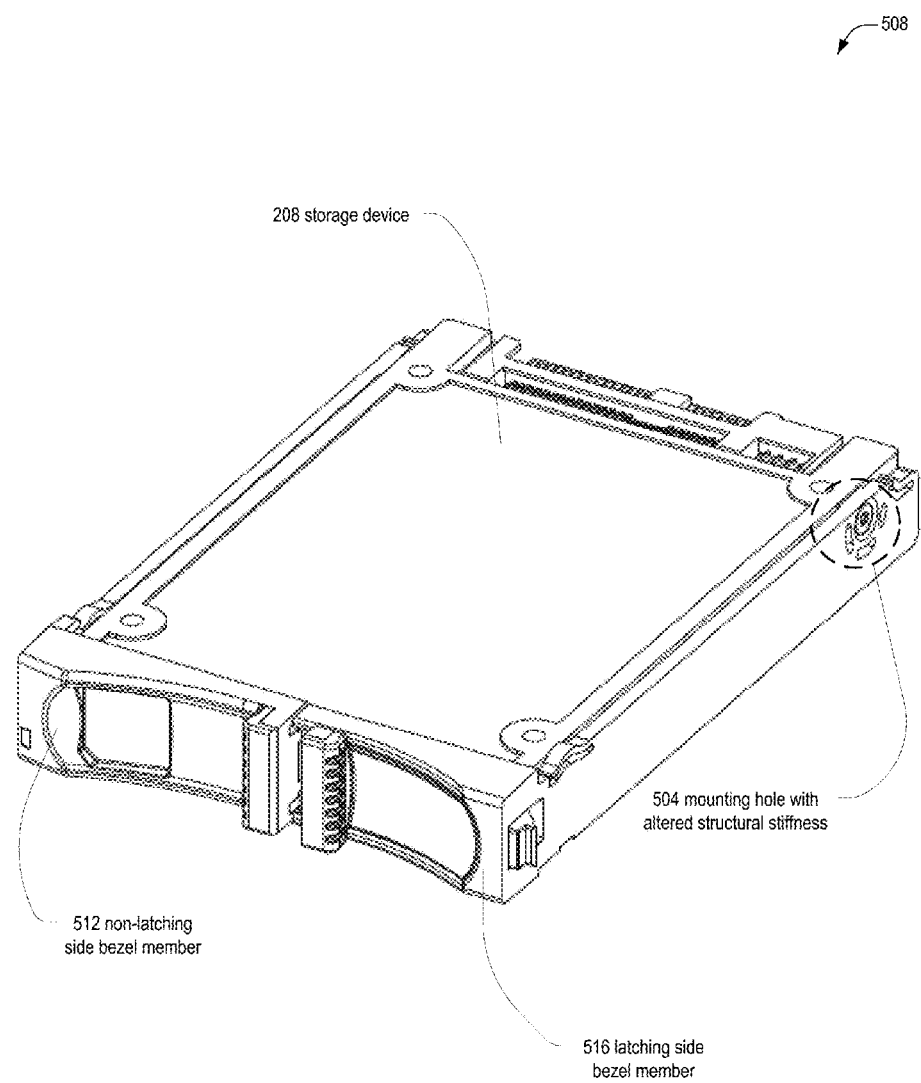

Fig. 5b Exploded view of improved mounted storage device of first embodiment
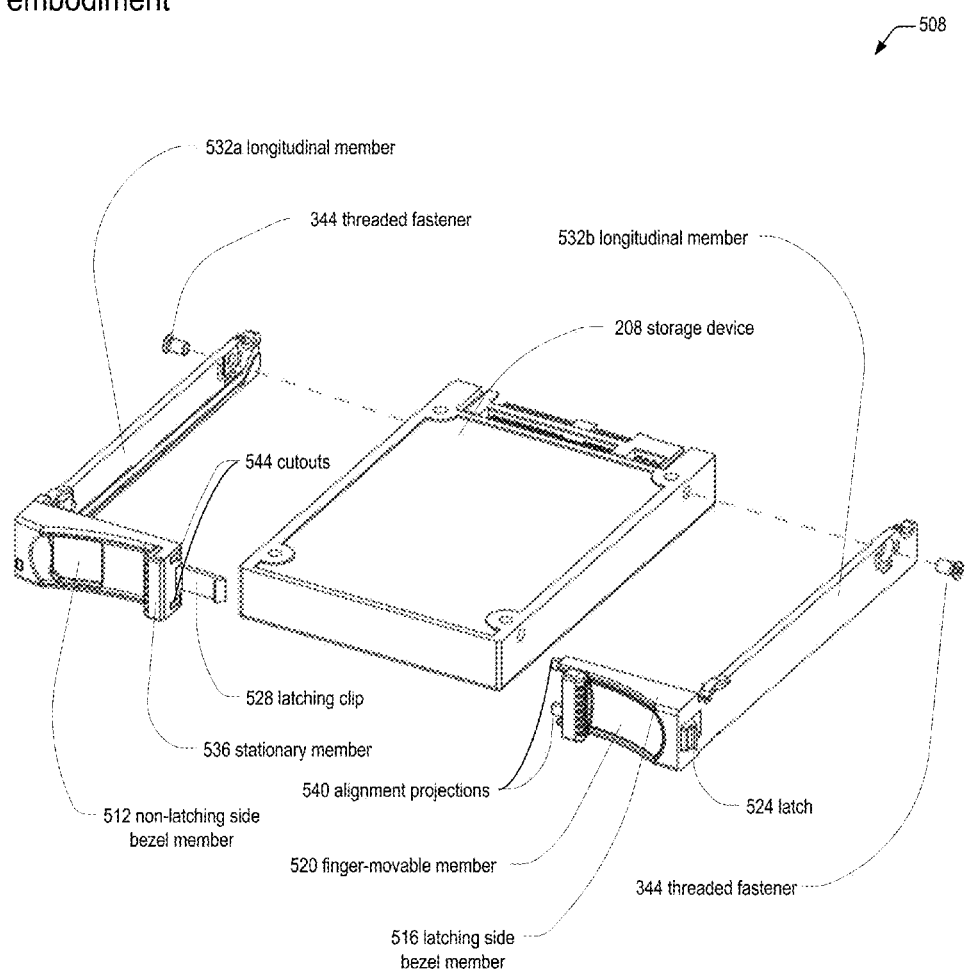

Fig. 5c Bottom rear view of improved storage device sled of first embodiment
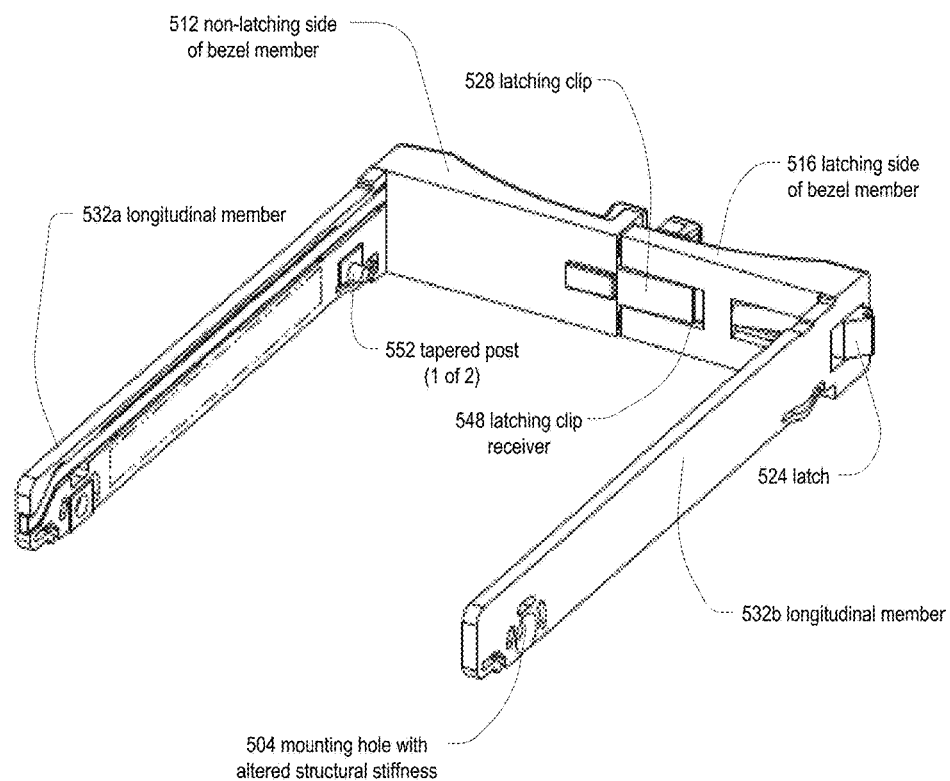

Fig. 5d  Side view of improved mounted storage device of first embodiment
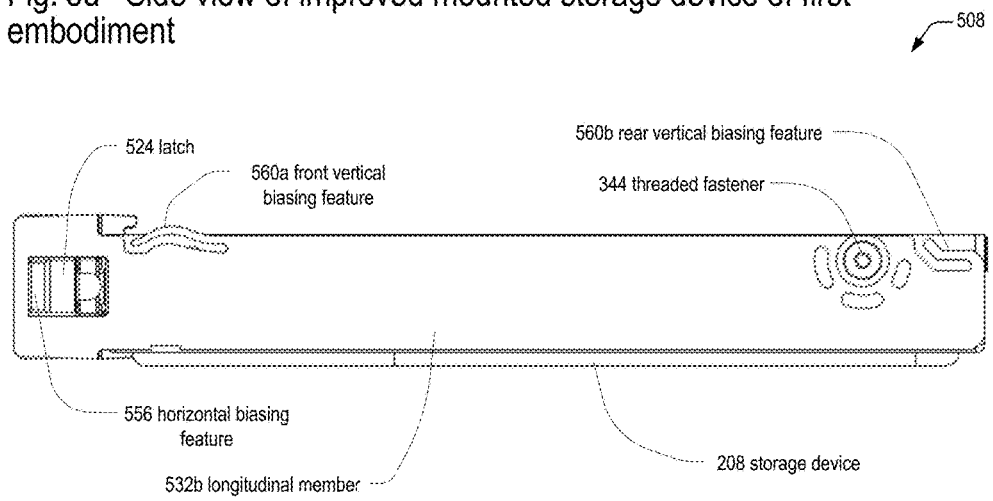
Fig. 5e  Detail view of improved mounted storage device of first embodiment
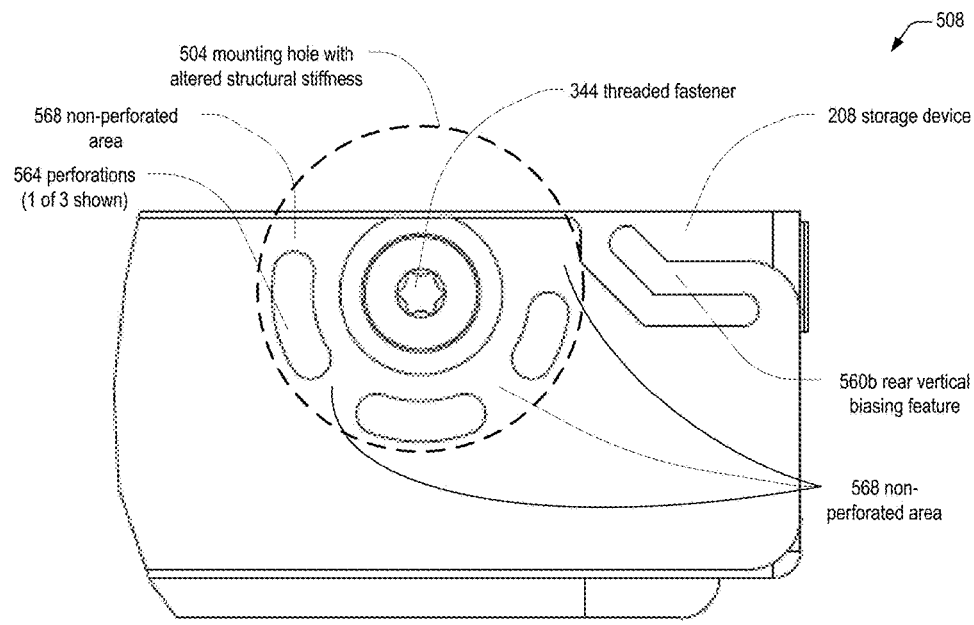

Fig. 5f  Top view of clip and latch arrangement of improved storage device sled of first embodiment
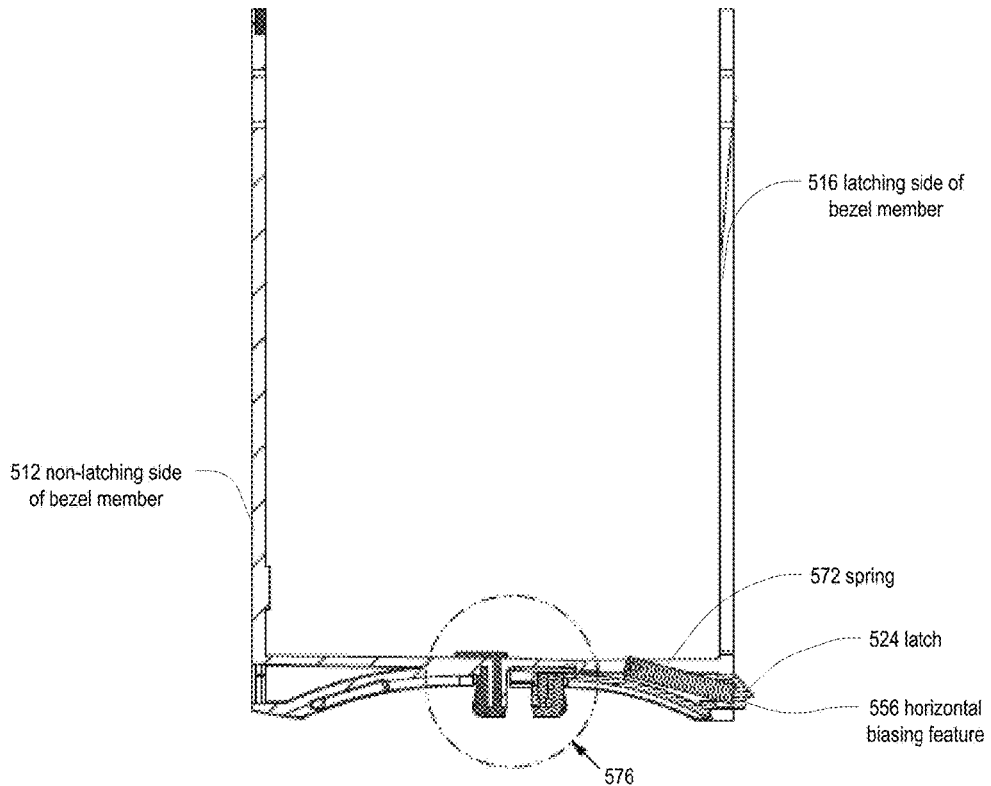
Fig. 5g  Detail view of clip and latch arrangement of improved storage device sled of first embodiment
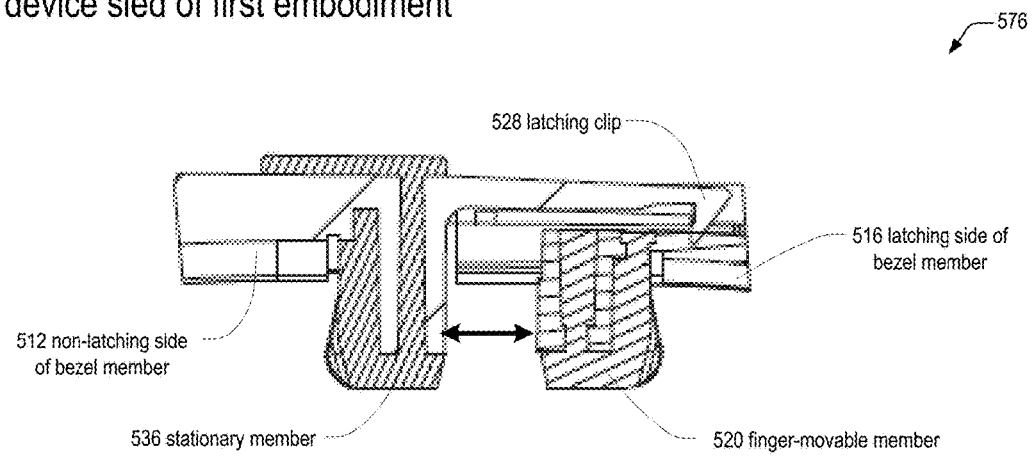

Fig. 6a First step of assembly sequence for improved mounted storage device of first embodiment
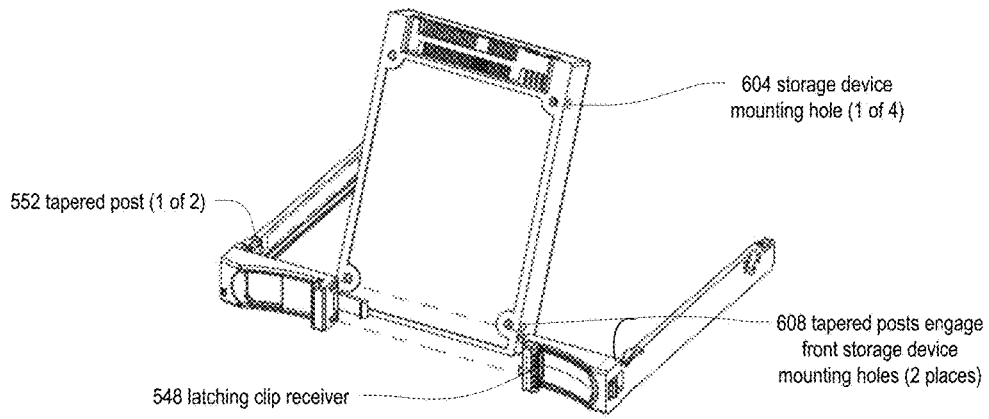
Fig. 6b Second step of assembly sequence for improved mounted storage device of first embodiment
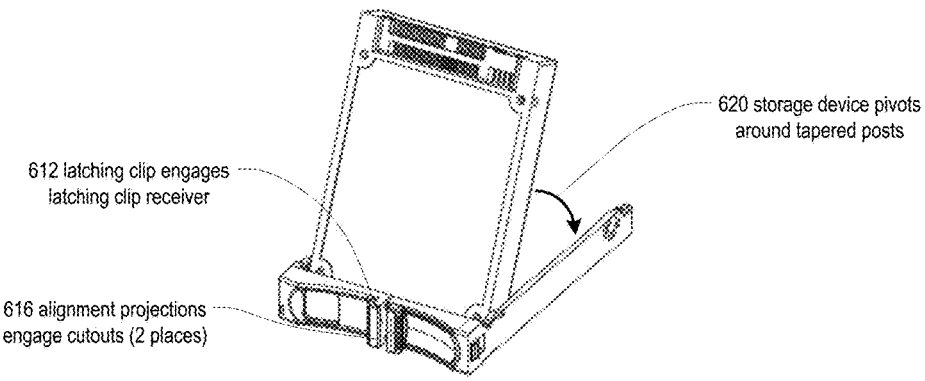
Fig. 6c Third step of assembly sequence for improved mounted storage device of first embodiment
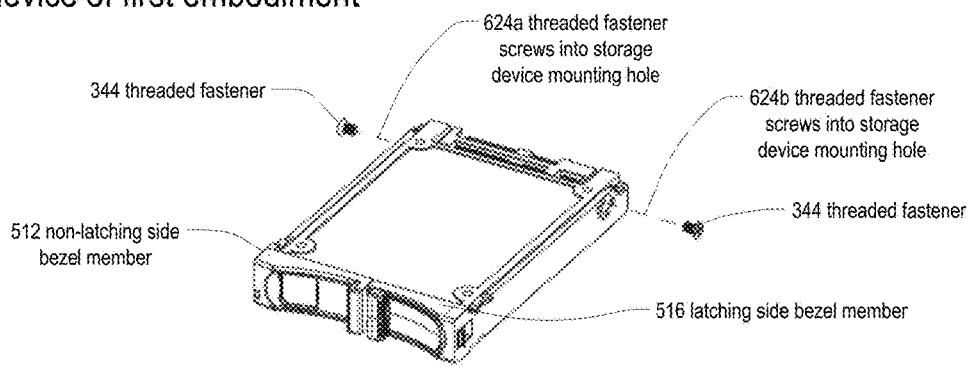

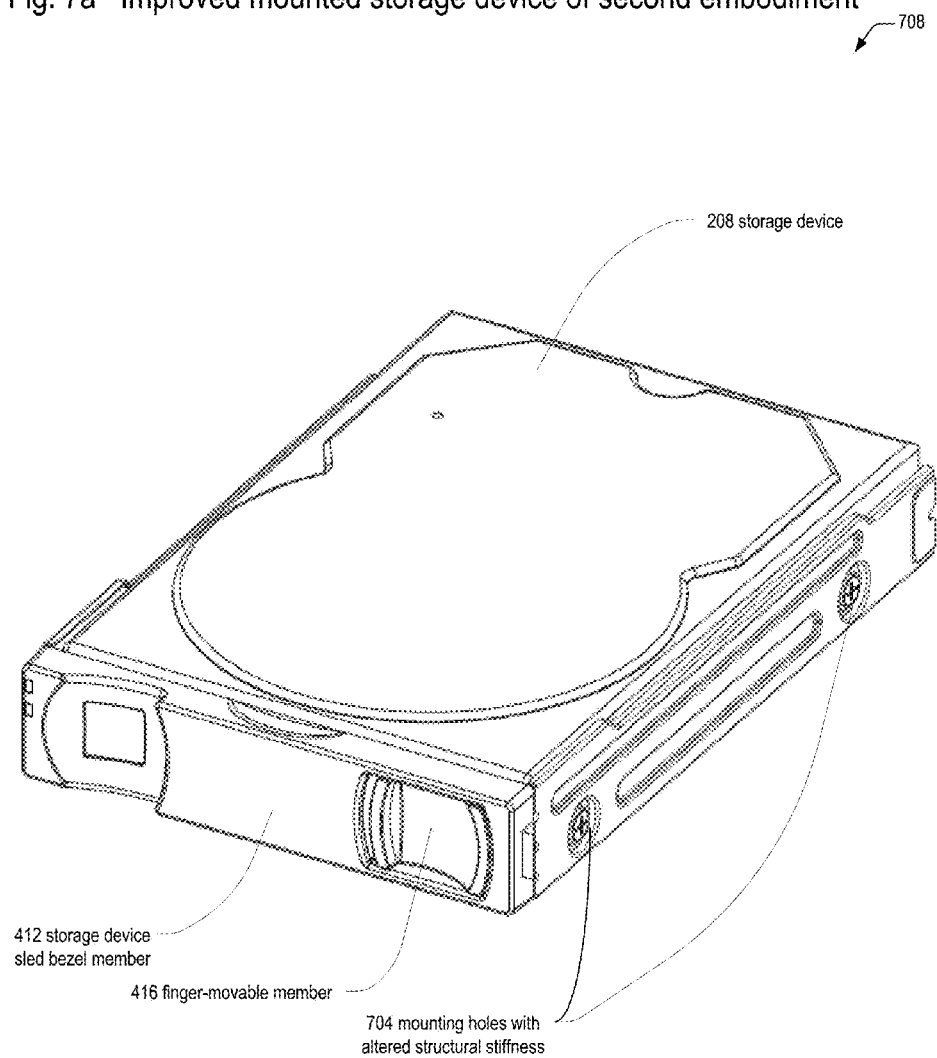
Fig. 7a Improved mounted storage device of second embodiment

Fig. 7b Exploded view of improved mounted storage device of second embodiment
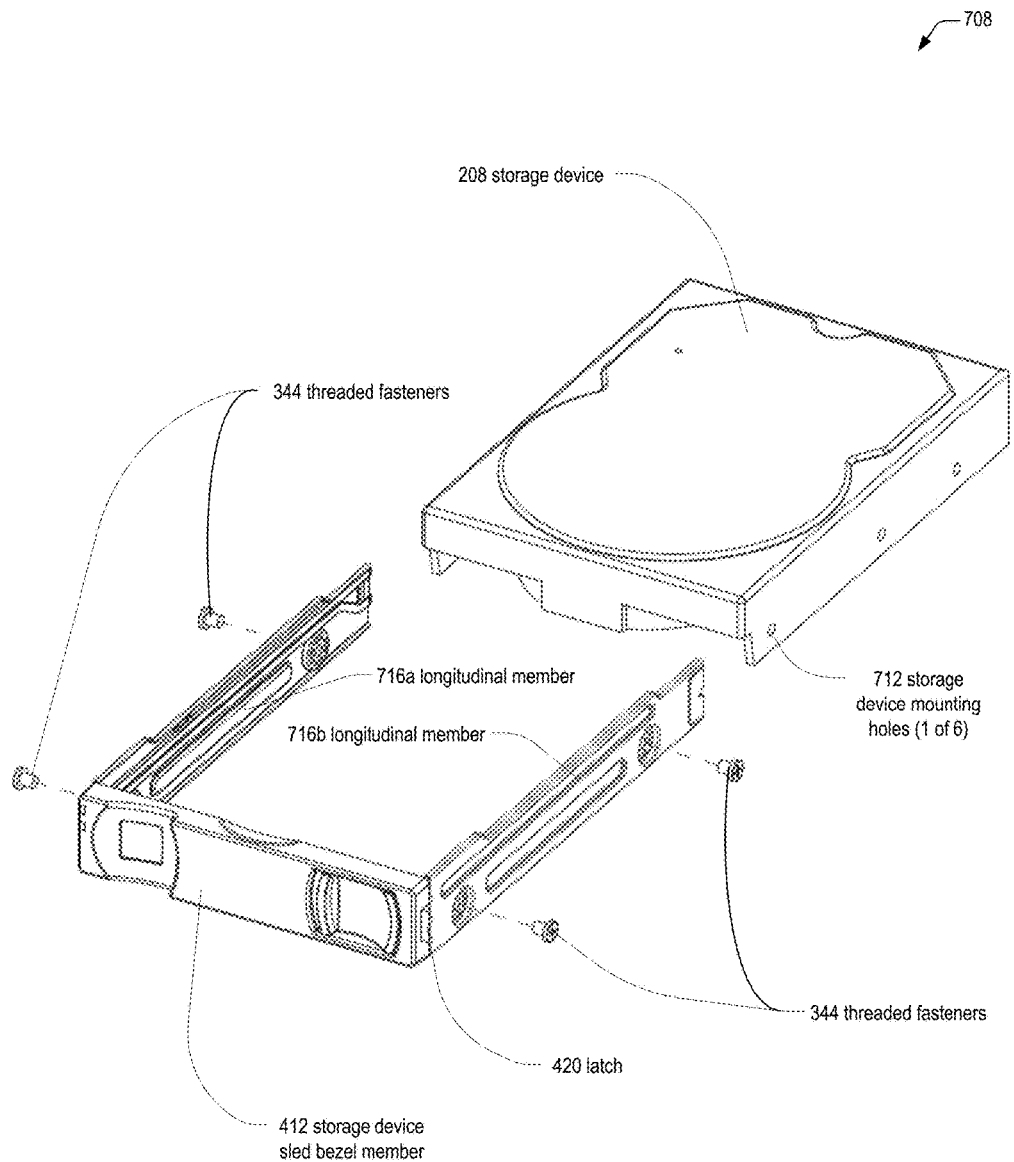

Fig. 7c  Side view of improved mounted storage device of second embodiment
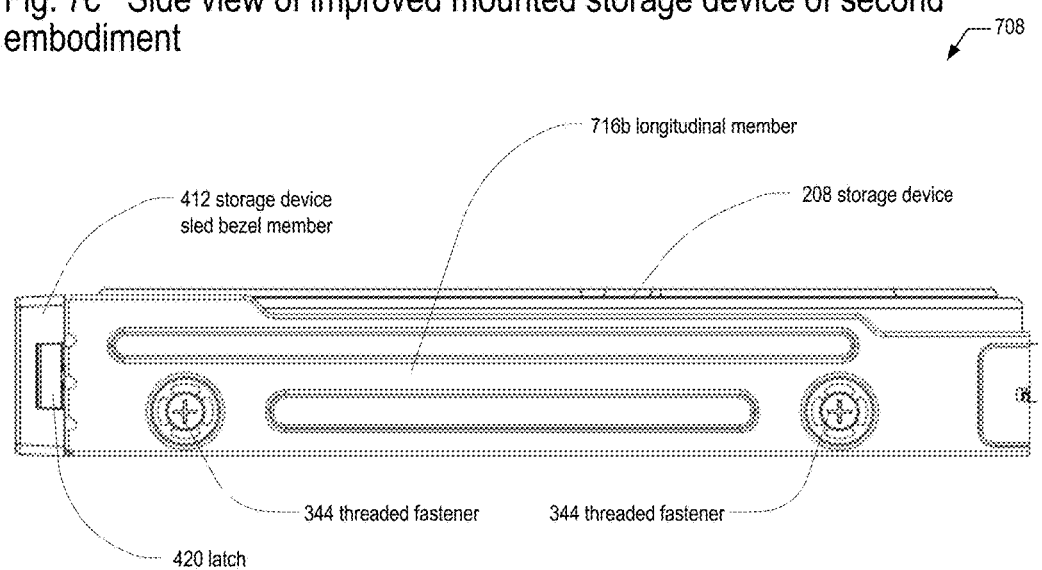
Fig. 7d  Detail view of improved mounted storage device of second embodiment
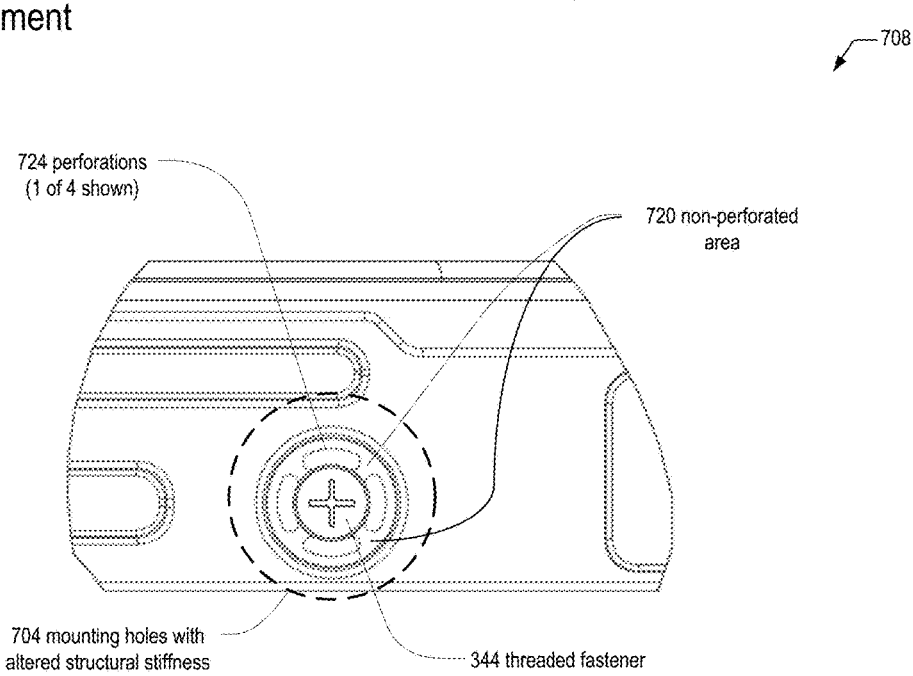

Fig. 8a Untreated shock response
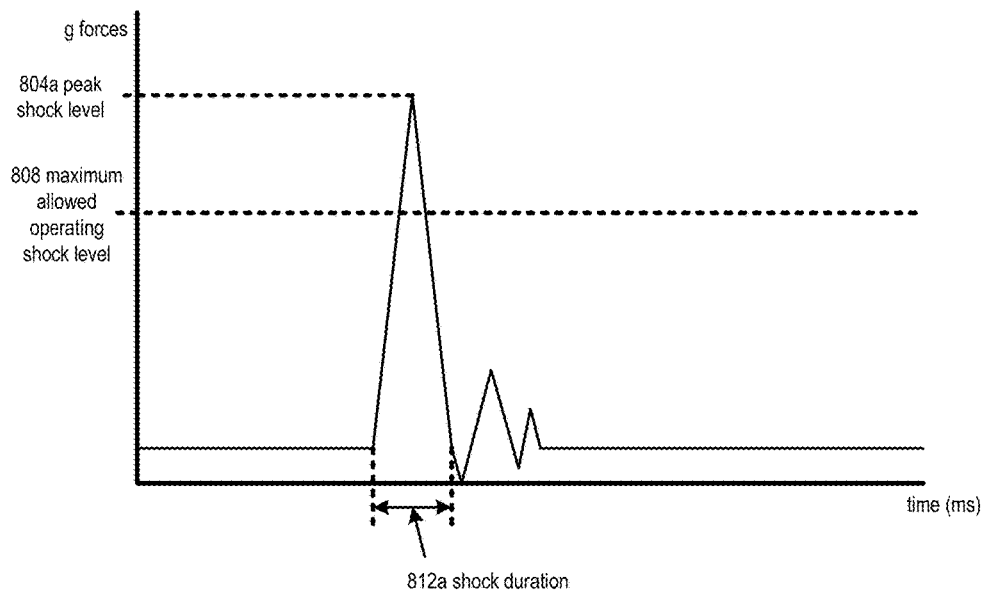
Fig. 8b Treated shock response
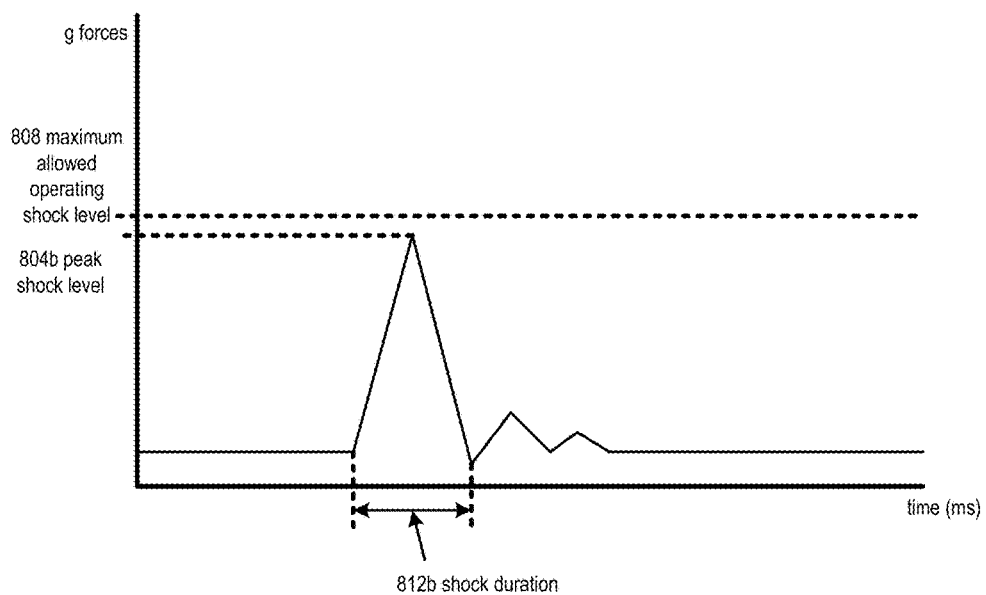

Fig. 9a Untreated vibration response
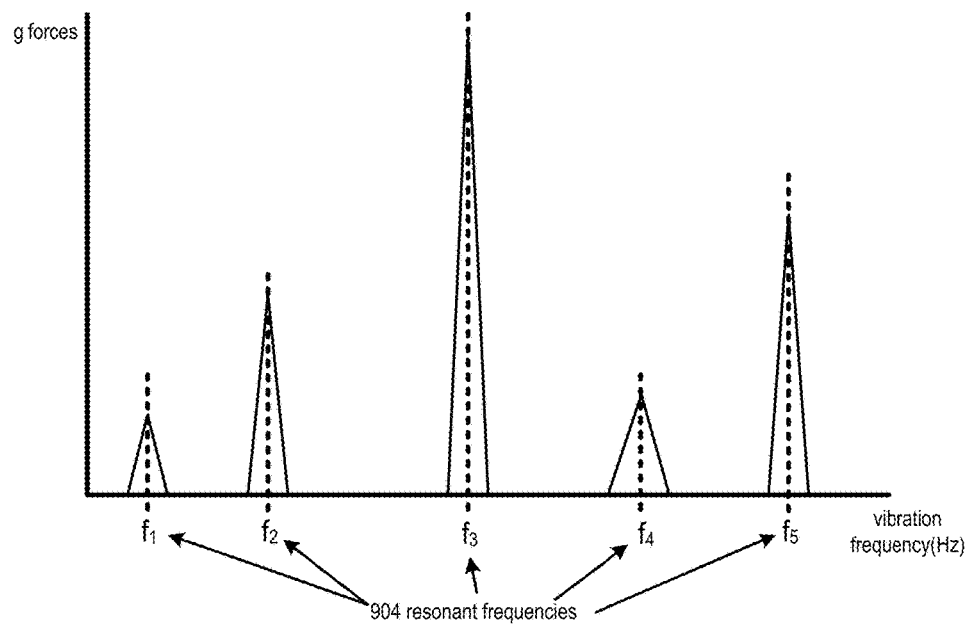
Fig. 9b I/O performance over frequency range
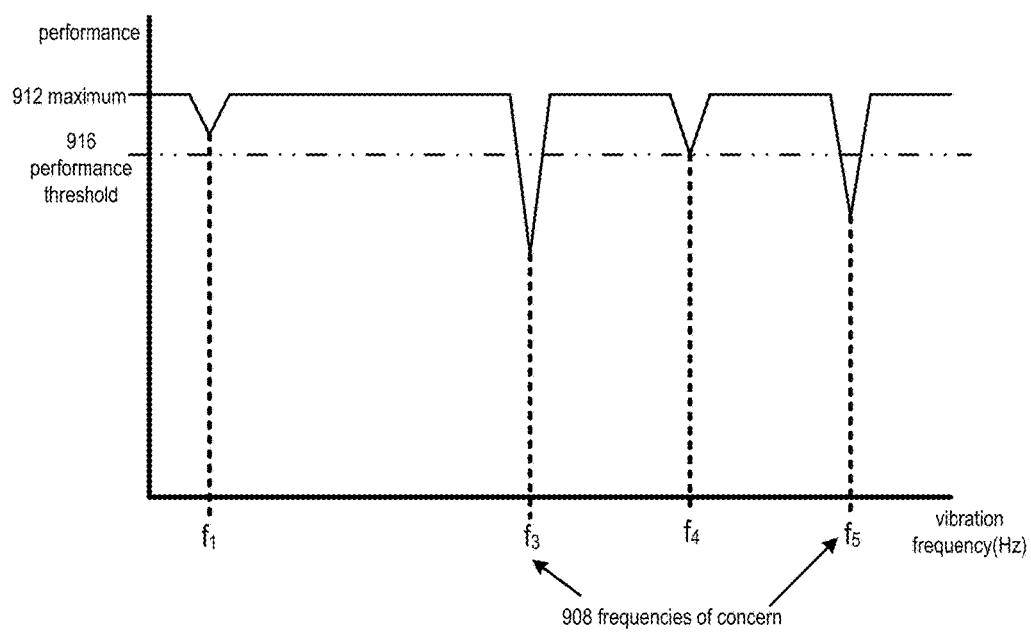

Fig. 9c Treated damped vibration response
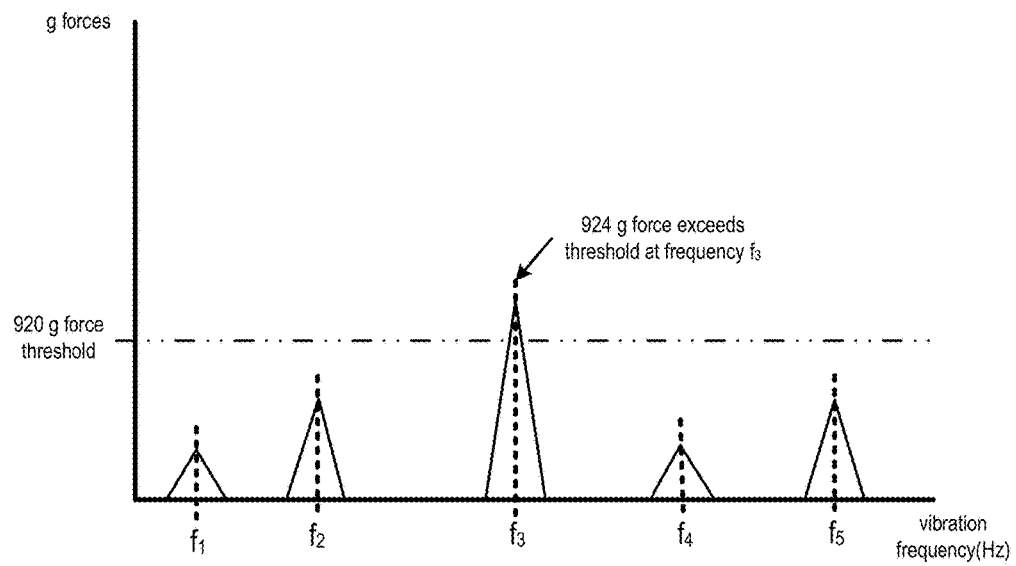
Fig. 9d Treated vibration response by reducing response frequencies
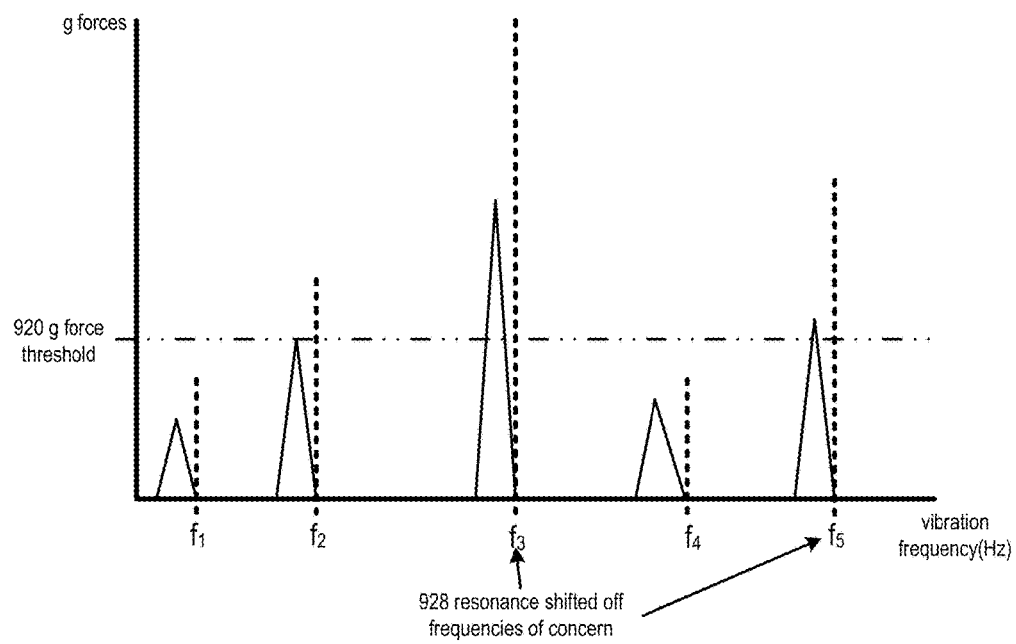

Fig. 9e Desired I/O performance response
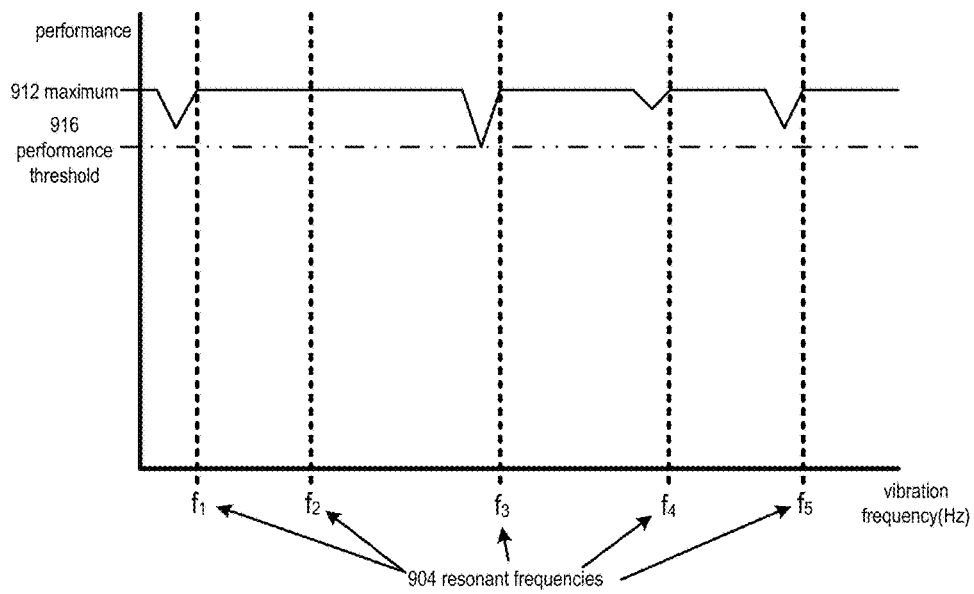
Fig. 9f Insufficient correction of I/O performance
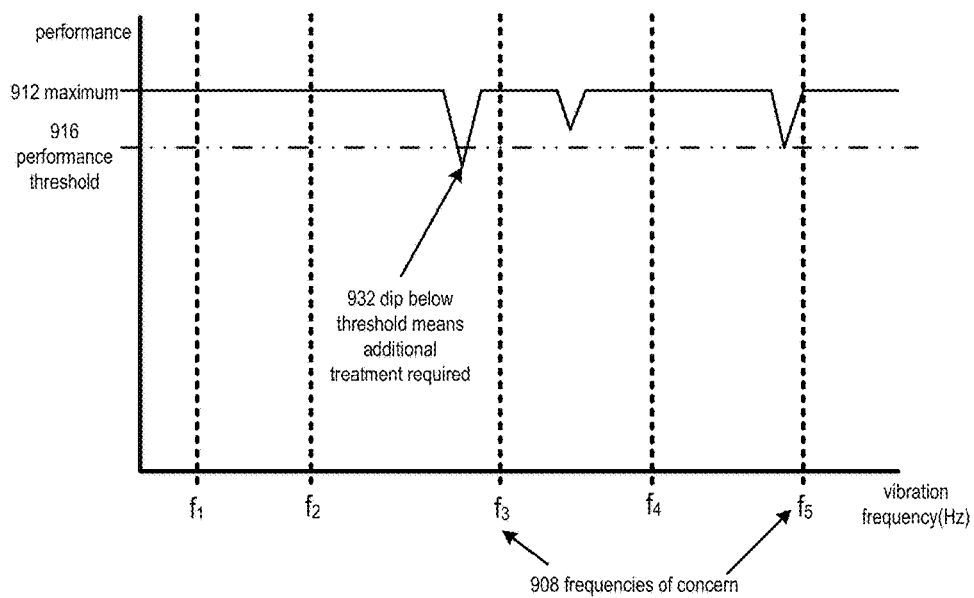

Fig. 10 Block diagram of resonant frequency determination configuration
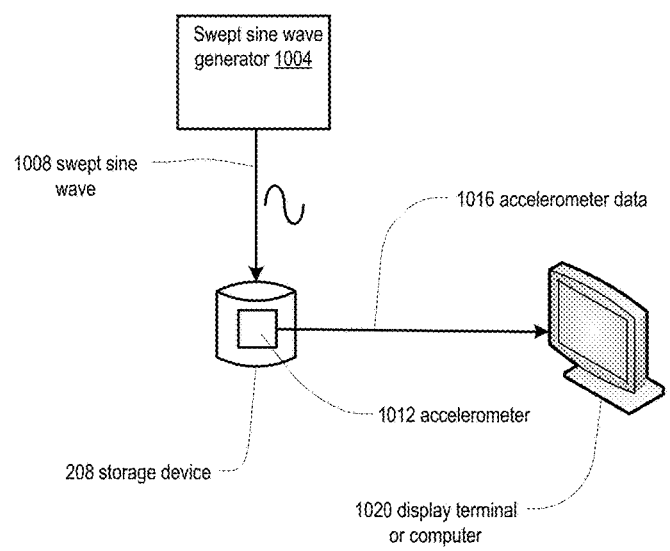

Fig. 11 Block diagram of shock and vibration evaluation configuration
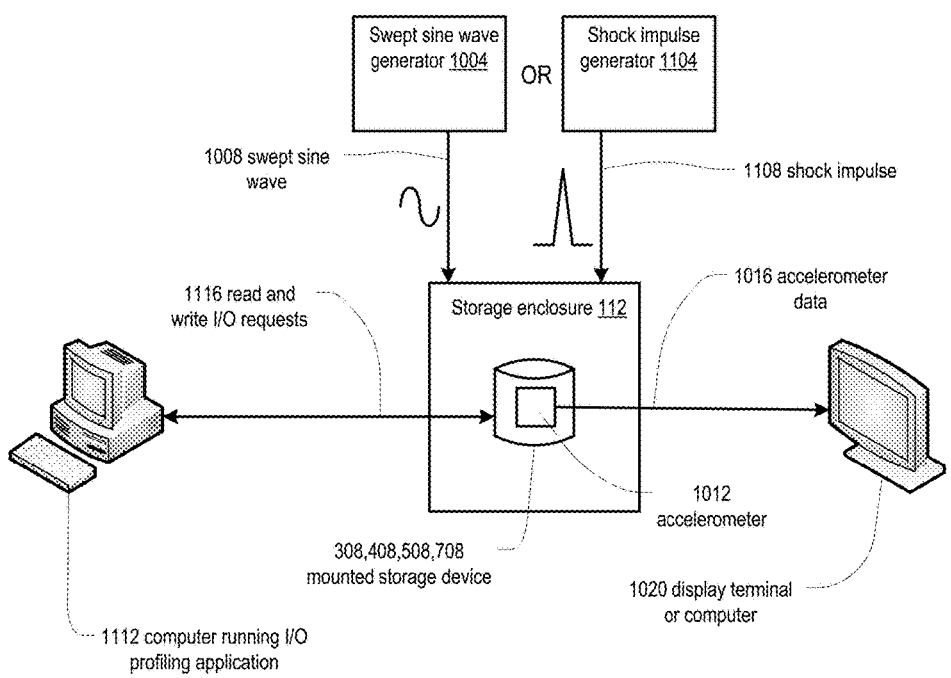

Fig. 12 Flowchart of shock optimization process
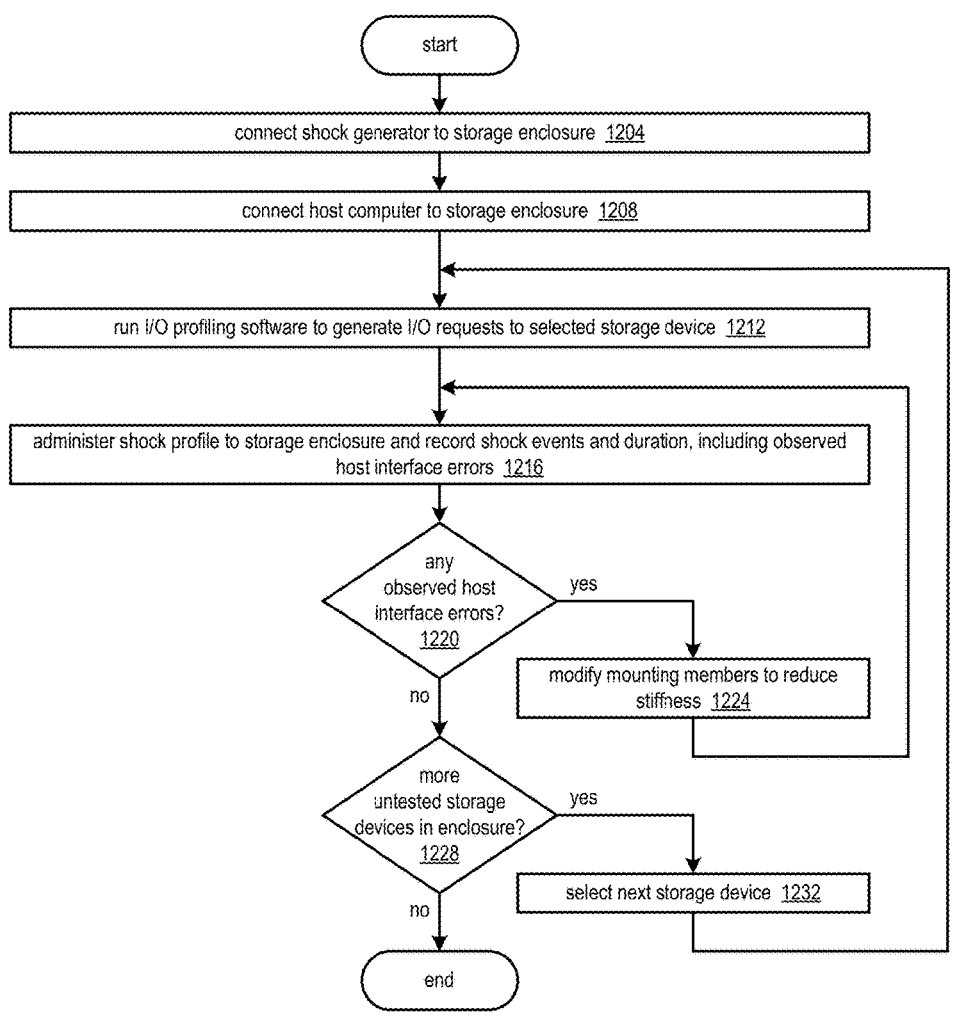

Fig. 13   Flowchart of vibration optimization process
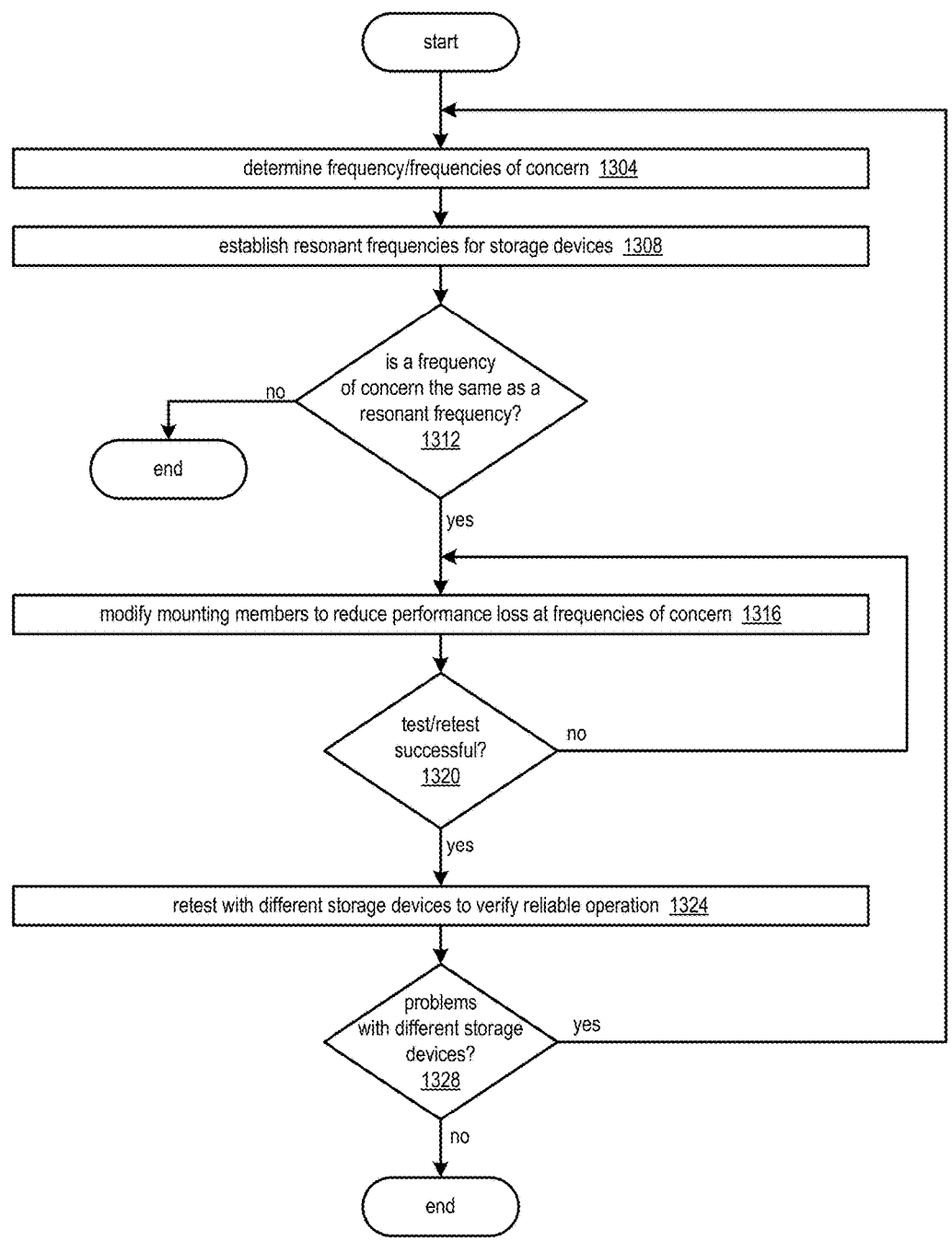

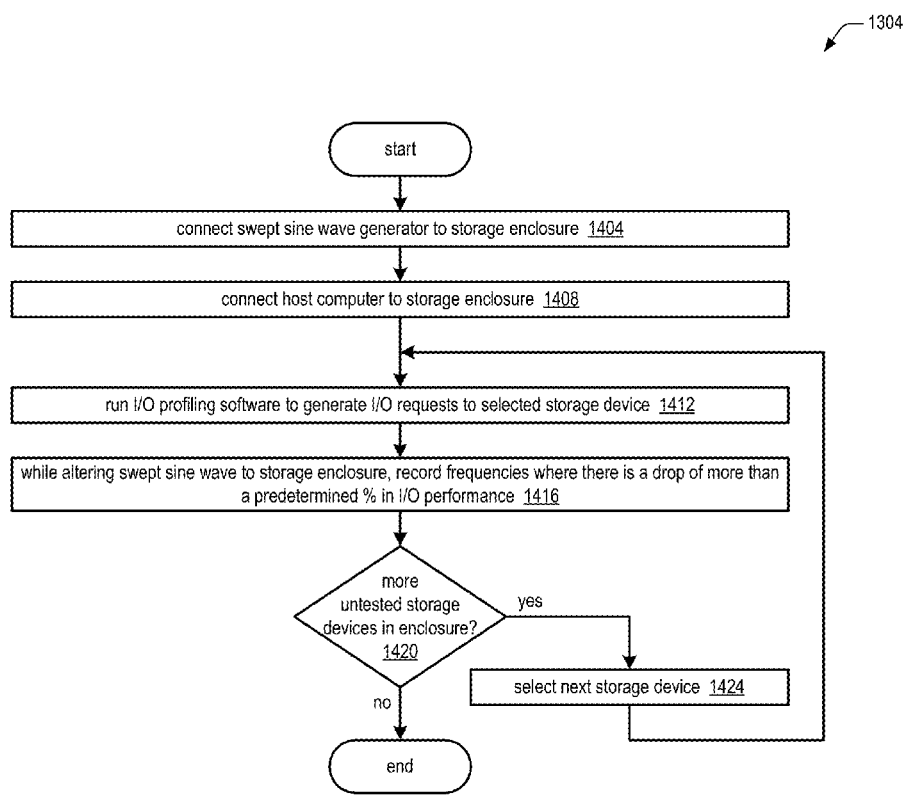
Fig. 14 Flowchart to determine frequency/frequencies of concern

Fig. 15 Flowchart to establish resonant frequencies of storage devices
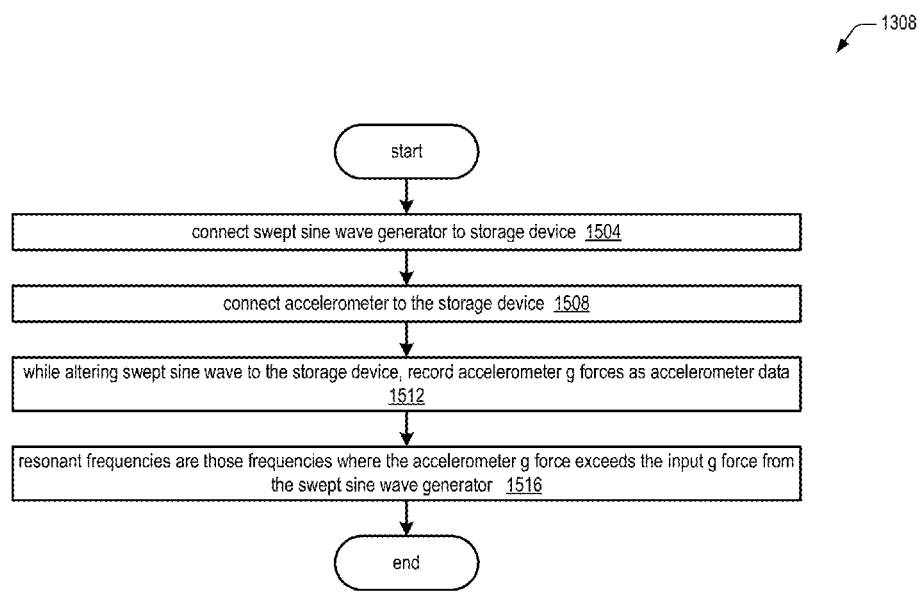

SELF-BIASING STORAGE DEVICE SLED

CROSS REFERENCE TO RELATED APPLICATION(S)

This application is related to pending non-Provisional U.S. application Ser. No. 14/871,050, filed Sep. 30, 2015, entitled METHOD AND APPARATUS FOR MITIGATING INDUCED SHOCK AND VIBRATION (inventors Christopher Ellis Schroeder, Charles Powell Morris, and Kevin Lee Van Pelt) and pending non-Provisional U.S. application Ser. No. 14/871,173, filed Sep. 30, 2015, entitled IMPROVED STORAGE DEVICE SLED AND ASSEMBLY METHOD THEREOF (inventors Kevin Lee Van Pelt, Charles Powell Morris, and Christopher Ellis Schroeder).

FIELD

The present invention is directed to computer data storage. In particular, the present invention is directed to improved storage device sleds with self-biasing features for mounting data storage devices in storage enclosures.

BACKGROUND

Storage subsystems provide system mass storage incorporating many storage devices. Storage devices usually include hard disk drives, but may include solid-state drives, optical drives, or tape drives. Storage subsystems include within a single storage chassis one or more storage devices, power supplies, and possibly one or more storage controllers, including Redundant Array of inexpensive disks (RAID) controllers.

In order to provide non-stop operation, redundant controllers, power supplies, and/or storage devices are often provided in the storage subsystem. Additionally, such assemblies are generally provided as field replaceable modules or FRUs. Field replaceable modules are packaged individually, in order to facilitate removal and replacement of individual controllers, power supplies, or storage devices. Additionally, such modules are often hot replaceable, and able to be replaced while the storage subsystem is powered up and even actively conducting I/O operations to one or more storage devices. Individual storage devices are commonly packaged within a storage device module consisting of a plastic or sheet metal tray for mounting the storage device and a front bezel incorporating a latching mechanism, and in some cases visual indicators.

Vibration is a mechanical phenomenon whereby oscillations occur about an equilibrium point. The oscillations may be periodic such as the motion of a pendulum or random such as the movement of a tire on a gravel road. Storage enclosures often include spinning devices such as fans or hard disk drives that generate vibrations related to rotation speed and how well motors are balanced. Storage enclosures may additionally be subject to shock events such as when a storage enclosure is dropped onto a hard surface or an outside force strikes the storage enclosure. Both vibration and shock may be transferred at least in part to operating storage devices, resulting in loss of performance and possibly degrading long-term reliability.

SUMMARY

The present invention is directed to solving disadvantages of the prior art. In accordance with embodiments of the present invention, a self-biasing storage device sled for mounting a storage device within a chassis is provided. The self-biasing storage device sled includes a bezel forming a front surface of the storage device sled. The bezel includes a first portion that is stationary relative to a storage device mounted within the storage device sled, a second portion vertically captured within the first portion and configured to slide transversely between an unlatching and a latching position, and a spring retained between the bezel first and second portions and configured to push the latch outwardly from the bezel. The second portion includes a finger-movable member, a latch configured to engage a matching opening in a first chassis interior side surface when the storage device sled is installed in the chassis, and a horizontal biasing feature adjacent to the latch and configured to move in concert with the latch. When the storage device is mounted to the storage device sled and installed in the chassis, the horizontal biasing feature exerts force against the first chassis interior side surface and biases the storage device sled against a second chassis interior side surface, where the second chassis interior side surface is on an opposite side of the storage device from the first chassis interior side surface.

In accordance with another embodiment of the present invention, a method for removing a self-biasing storage device sled from a chassis is provided. The method includes moving, by a finger, a finger-movable member of a second portion of a storage device sled bezel horizontally toward the center of a first portion of the storage device sled bezel, where the second portion is vertically captured within the first portion and is configured to slide transversely between an unlatching and a latching position. The second portion includes a latch, configured to engage a matching opening in a first chassis interior side surface when the storage device sled is installed in the chassis, and a horizontal biasing feature adjacent to the latch and configured to move in concert with the latch. The method also includes unloading, by the second portion, the horizontal biasing feature away from the first interior side surface of the chassis, where the horizontal biasing feature does not exert force against chassis interior side surfaces when unloaded. The method further includes unlatching, by the second portion, the latch from the matching opening in the first chassis interior side surface and pulling the storage device sled from the chassis.

An advantage of the present invention is it provides a storage device sled that includes both vertical and horizontal integral self-biasing features to self-bias a mounted storage device within a storage enclosure. The mounted storage device includes a storage device securely mounted to the storage device sled. The self-biasing features load the mounted storage device under spring pressure within the chassis and minimize adverse affects due to induced shock and vibration.

Another advantage of the present invention is that the self-biasing features are integral to the storage device sled longitudinal and latching members. Therefore, additional components are not required to provide the self-biasing features, and the advantages of a self-biasing storage device sled can be advantageously provided relative to a non-biased storage device sled.

Additional features and advantages of embodiments of the present invention will become more readily apparent from the following description, particularly when taken together with the accompanying drawings.

BRIEF DESCRIPTION OF THE DRAWINGS

FIG. 1 is a block diagram illustrating components of a data storage network in accordance with embodiments of the present invention.

FIG. 2a is a block diagram illustrating components of a host-based or expansion data storage system in accordance with embodiments of the present invention.

FIG. 2b is a block diagram illustrating components of a non host-based data storage system in accordance with embodiments of the present invention.

FIG. 3a is a diagram illustrating an isometric view of a storage enclosure with a drawer extended in accordance with a first embodiment of the present invention.

FIG. 3b is a diagram illustrating an isometric view of a storage device mounted in a drawer in accordance with a first embodiment of the present invention.

FIG. 3c is a diagram illustrating an isometric view of a conventional mounted storage device in accordance with a first embodiment of the conventional art.

FIG. 3d is a diagram illustrating an exploded isometric view of a conventional mounted storage device in accordance with a first embodiment of the conventional art.

FIG. 4a is a diagram illustrating an isometric view of a storage enclosure with a mounted storage device removed in accordance with a second embodiment of the present invention.

FIG. 4b is a diagram illustrating an isometric view of a conventional mounted storage device in accordance with a second embodiment of the conventional art.

FIG. 4c is a diagram illustrating an exploded isometric view of a conventional mounted storage device in accordance with a second embodiment of the conventional art.

FIG. 5a is a diagram illustrating an isometric view of an improved mounted storage device in accordance with a first embodiment of the present invention.

FIG. 5b is a diagram illustrating an exploded isometric view of an improved mounted storage device in accordance with a first embodiment of the present invention.

FIG. 5c is a diagram illustrating a bottom rear isometric view of an improved storage device sled in accordance with a first embodiment of the present invention.

FIG. 5d is a diagram illustrating a side view of an improved mounted storage device in accordance with a first embodiment of the present invention.

FIG. 5e is a diagram illustrating a detail view of an improved mounted storage device in accordance with a first embodiment of the present invention.

FIG. 5f is a diagram illustrating a top view of a clip and latch arrangement of an improved storage device sled in accordance with a first embodiment of the present invention.

FIG. 5g is a diagram illustrating a detail view of a clip and latch arrangement of an improved storage device sled in accordance with a first embodiment of the present invention.

FIG. 6a is a diagram illustrating a first step of an assembly sequence for an improved mounted storage device in accordance with a first embodiment of the present invention.

FIG. 6b is a diagram illustrating a second step of an assembly sequence for an improved mounted storage device in accordance with a first embodiment of the present invention.

FIG. 6c is a diagram illustrating a third step of an assembly sequence for an improved mounted storage device in accordance with a first embodiment of the present invention.

FIG. 7a is a diagram illustrating an isometric view of an improved mounted storage device in accordance with a second embodiment of the present invention.

FIG. 7b is a diagram illustrating an exploded isometric view of an improved mounted storage device in accordance with a second embodiment of the present invention.

FIG. 7c is a diagram illustrating a side view of an improved mounted storage device in accordance with a second embodiment of the present invention.

FIG. 7d is a diagram illustrating a detail view of an improved mounted storage device in accordance with a second embodiment of the present invention.

FIG. 8a is a diagram illustrating an untreated shock response in accordance with embodiments of the present invention.

FIG. 8b is a diagram illustrating a treated shock response in accordance with embodiments of the present invention.

FIG. 9a is a diagram illustrating an untreated vibration response in accordance with embodiments of the present invention.

FIG. 9b is a diagram illustrating storage device I/O performance over a predetermined frequency range in accordance with embodiments of the present invention.

FIG. 9c is a diagram illustrating a treated damped vibration response in accordance with embodiments of the conventional art.

FIG. 9d is a diagram illustrating a treated vibration response by reducing response frequencies in accordance with embodiments of the present invention.

FIG. 9e is a diagram illustrating desired post-treatment I/O performance response according to embodiments of the present invention.

FIG. 9f is an illustration of insufficient correction of I/O performance according to embodiments of the present invention.

FIG. 10 is a block diagram illustrating a resonant frequency determination configuration in accordance with embodiments of the present invention.

FIG. 11 is a block diagram illustrating a shock and vibration evaluation configuration in accordance with embodiments of the present invention.

FIG. 12 is a flowchart illustrating a storage device shock optimization process in accordance with the preferred embodiment of the present invention.

FIG. 13 is a flowchart illustrating a storage device vibration optimization process in accordance with the preferred embodiment of the present invention.

FIG. 14 is a flowchart illustrating a process to determine a frequency or frequencies of concern for a storage device in accordance with the preferred embodiment of the present invention.

FIG. 15 is a flowchart illustrating a process to establish resonant frequencies of storage devices in accordance with the preferred embodiment of the present invention.

DETAILED DESCRIPTION

The present invention is directed to the problem of reducing induced shock and vibration to storage devices in storage enclosures. Referring now to FIG. 1, a block diagram illustrating components of a data storage network 100 in accordance with embodiments of the present invention is shown. Data storage network 100 provides interconnection between one or more host computers 108 and one or more storage enclosures 112. Network 104 includes networking communication technologies suitable for high-volume data transfers between host computers 108 and storage enclosures 112. Such technologies include Fiber Channel, Ethernet, SSA, SAS, iSCSI, Infiniband, ESCON, and FICON. Network 104 includes, but is not limited to local area networks (LANs), storage area networks (SANs), and cellular communication networks.

Host computers 108 execute application programs, and communicate with other host computers 108 or storage enclosures 112 through network 104. Storage enclosures 112 include storage devices that provide mass data storage. Storage devices include hard disk drives, tape drives, optical drives, and solid state drives. In some embodiments, data storage network 100 includes one or more management computers 116. Management computers 116 monitor network 104, and provide error monitoring, configuration, and control functions. In most embodiments, management computer 116 includes a graphical user interface (GUI) 120, through which users or system administrators interact with management computer 116. In some embodiments, management computer 116 interfaces with storage enclosures 112 through network 104. In other embodiments, management computer 116 interfaces with storage enclosures 112 through a different connection or network other than network 104. Although three host computers 108a, 108b, 108c and three storage enclosures, 112a, 112b, 112c are shown in FIG. 1, network 104 includes any number of host computers 108 and storage enclosures 112.

Referring now to FIG. 2a, a block diagram illustrating components of a host-based or expansion data storage system 200 in accordance with embodiments of the present invention is shown.

The data storage system 200 includes one or more host computers 108. Host computer 108 is generally a server, but could also be a desktop or mobile computer. Host computer 108 executes application programs that generate read and write requests to a storage controller 204 within the host computer 108. In some embodiments, storage controller 204 is a host bus adapter or storage controller card in host computer 108. In other embodiments, storage controller 204 is a combination of an I/O controller often on a motherboard of host computer 108 and software applications running on one or more processors of host computer 108. Storage controller 204 communicates with storage devices 208 in a drawer 212 of JBOD storage enclosure 112 over host bus or network 104. Host bus or network 104 in one embodiment is a bus such as SCSI, FC-AL, USB, Firewire, SSA, SAS, SATA, or Infiniband. In another embodiment, host bus or network 104 is a network such as Ethernet, iSCSI, Fiber Channel, SSA, ESCON, ATM, FICON, or Infiniband.

Host computer 108 interfaces with one or more storage controllers 204, although only a single storage controller 204 is illustrated for clarity. In one embodiment, storage controller 204 is a RAID controller. In another embodiment, storage controller 204 is a storage appliance such as a provisioning, virtualization, replication, or backup appliance. Storage controller 204 transfers data to and from storage devices 208a-208z in drawer 212 of JBOD storage enclosure 112.

JBOD Storage enclosure 112 in one embodiment contains 48 storage devices 208, with 16 storage devices 208 in each of three drawers 212. In other embodiments, JBOD Storage enclosure 112 may contain fewer or more than 48 storage devices 208, or include all storage devices 208 in a single chassis without drawers 212. Storage devices 208 include various types of storage devices, including hard disk drives, solid state drives, optical drives, and tape drives. Within a specific storage device 208 type, there may be several sub-categories of storage devices 208, organized according to performance. For example, hard disk drives may be organized according to cache size, drive RPM (5,400, 7,200, 10,000, and 15,000, for example), queue depth, random transfer rate, or sequential transfer rate.

Referring now to FIG. 2b, a block diagram illustrating components of a non host-based data storage system 216 in accordance with embodiments of the present invention is shown. Non host-based data storage system 216 is similar to host-based or expansion data storage system 200, with the exception being storage controller 204 is within storage enclosure 112, along with storage devices 208. In the embodiment illustrated in FIG. 2b, storage controller 204 is a single RAID controller 204. However, in other embodiments, storage controller 204 represents multiple RAID or other storage controllers 204 discussed with respect to FIG. 2a.

Referring now to FIG. 3a, a diagram illustrating an isometric view of a storage enclosure 112a with a drawer 212 extended in accordance with a first embodiment of the present invention is shown. Storage enclosure 112a includes a plurality of drawers 212, each of which stores a plurality of mounted storage devices 308, 508 in a chassis 304. Chassis 304 also includes one or more power supplies, and in some embodiments, one or more storage controllers 204. In the embodiment illustrated, each drawer 212 stores up to 16 mounted storage devices 308, 508, where all storage devices 208 have a 2.5 inch form factor. However, the present invention is not limited to any number of drawers 212, mounted storage devices 308, 508, or storage devices 208.

Referring now to FIG. 3b, a diagram illustrating an isometric view of a storage device 208 mounted in a drawer 212 in accordance with a first embodiment of the present invention is shown. It is generally assumed that all drawers 212 have a similar general configuration, and store the same number of mounted storage devices 308, 508.

Each mounted storage device 308, 508 is individually removable and insertable from drawer 212. This allows rapid replacement of a failed storage device 208 with a spare or otherwise working storage device 208. Each mounted storage device 308, 508 therefore includes a rail system to slide the mounted storage device 308, 508 into the drawer 212, as well as a means to latch each mounted storage device 308, 508 into the chassis 304 or drawer 212.

Mounted storage devices 308, 508 include a finger-actuated latching mechanism to allow a latch of the mounted storage device 308, 508 to engage a matching opening 320 in a first chassis interior side surface 312. In most cases, only a single latch is provided in each mounted storage device 308, 508. Correspondingly, the drawer 212 has a second chassis interior side surface 316 opposite the first chassis interior side surface 312 that lacks a matching opening 320 or other latch receiving feature. In storage enclosures 112a of the first embodiment, each drawer 212 must be extended from the chassis 304 in order to insert or remove mounted storage devices 308, 508.

Referring now to FIG. 3c, a diagram illustrating an isometric view of a conventional mounted storage device 308 in accordance with a first embodiment of the conventional art is shown. The conventional mounted storage device 308 does not include primary features of the present invention, and instead represents conventional features intended to mitigate the effect of shock and vibration events to storage devices 208.

The conventional mounted storage device 308 provides a sliding rail system and other features mounted to a storage device 208 to allow storage device 208 to be individually inserted or removed from a chassis 304 or drawer 212. One half of the conventional mounted storage device 308 is a non-latching side of a storage device sled 324, and the other half of the conventional mounted storage device 308 is a latching side of a storage device sled 328. The latching side of the storage device sled 328 includes an integral latch 336 that moves relative to the matching opening 320 when the finger grabs 332 are pinched together. The conventional mounted storage device 308 includes shock and vibration absorbing features in the form of elastomeric overmold around mounting holes 340. The elastomeric overmold 340 is formed over side member material, and is generally rubber or an elastic polymer. Although the elastomer overmold around mounting holes 340 is effective for shock and vibration mitigation, applying the overmold 340 adds cost to the mounted storage device 308 by requiring additional manufacturing processes and material. It is desirable to provide shock and vibration mitigation in a mounted storage device 308 without requiring different materials or manufacturing steps to apply the different materials.

Referring now to FIG. 3d, a diagram illustrating an exploded isometric view of a conventional mounted storage device 308 in accordance with a first embodiment of the conventional art is shown. Conventional mounted storage device 308 includes two halves, each mounted to a side of storage device 208 through threaded fasteners 344.

The latching side of the storage device sled 328 deflects under finger pressure relative to the non-latching side of the storage device sled 324, which allows a latch in the side of the latching side of the storage device sled 328 to disengage from the matching opening 320. The threaded fasteners 344 engage mounting holes in the side of the storage device 208, and the elastomer overmold around the mounting holes 340 mechanically isolates each of the threaded fasteners 344 from the storage device sled 324, 328.

Referring now to FIG. 4a, a diagram illustrating an isometric view of a storage enclosure 112b with a mounted storage device 408, 708 removed in accordance with a second embodiment of the present invention is shown. In the second embodiment, mounted storage devices 408 708 are directly inserted or removed from a chassis 404, and individual storage device drawers 212 are not present. In the embodiment illustrated in FIG. 4a, the storage devices 208 are all 3.5" in form factor. In general, mounted storage devices 308, 408, 508, 708 are all hot pluggable into a back planar midplane within a chassis 304, 404 or drawer 212.

Referring now to FIG. 4b, a diagram illustrating an isometric view of a conventional mounted storage device 408 in accordance with a second embodiment of the conventional art is shown. The conventional mounted storage device 408 does not include the shock and vibration mitigation features of the present invention, and instead represents conventional features intended to mitigate the effect of shock and vibration events to storage devices 208.

The conventional mounted storage device 408 provides a sliding rail system and other features mounted to a storage device 208 to allow storage device 208 to be individually inserted or removed from the chassis 404. The conventional mounted storage device 408 includes a storage device sled bezel 412 mounted across the front of a storage device sled, with side pieces extending rearward that physically mount to the sides of storage device 208. The storage device sled bezel 412 includes a finger movable member 416 coupled to a latch 420 that engages the matching opening 320 in the side of the chassis 404. The conventional mounted storage device 408 includes shock and vibration absorbing features in the form of elastomeric overmold around mounting holes 420. The elastomeric overmold 420 is formed over side member material, and is generally rubber or an elastic polymer. Although the elastomer overmold around mounting holes 420 is effective for shock and vibration mitigation, applying the overmold 420 adds cost to the mounted storage device 408 by requiring additional manufacturing processes and material. It is desirable to provide shock and vibration mitigation in a mounted storage device 408 without requiring different materials or manufacturing steps to apply the different materials.

Referring now to FIG. 4c, a diagram illustrating an exploded isometric view of a conventional mounted storage device 408 in accordance with a second embodiment of the conventional art is shown. The conventional mounted storage device 408 includes a storage device 208 mounted to a storage device sled by a plurality of threaded fasteners 344. In most cases, the threaded fasteners 344 are conventional sheet metal screws. Each of the threaded fasteners 344 engages a different mounting hole on the sides of the storage device 208, through an elastomer overmold around mounting holes 424.

Referring now to FIG. 5a, a diagram illustrating an isometric view of an improved mounted storage device 508 in accordance with a first embodiment of the present invention is shown. The improved mounted storage device 508 is able to mount within the same drawer 212 or chassis 304 is the conventional mounted storage device 308. Additionally, the storage device sled includes a non-latching side bezel member 512 as well as a latching side bezel member 516.

However, a key difference between the improved mounted storage device 508 and the conventional mounted storage device 308 involves the attachment area of the storage device sled around the holes through which threaded fasteners 344 are coupled to the sides of storage device 208. Instead of an elastomer overmold around the mounting holes 340, the improved mounted storage device 508 includes no elastomer compound or other material separate from the side rails of the storage device sled to provide shock or vibration reduction to the storage device 208. Rather, the area around the holes has an altered structural stiffness 504 compared to an unmodified storage device sled. The area of altered structural stiffness 504 will be discussed in more detail with respect to FIG. 5e.

Referring now to FIG. 5b, a diagram illustrating an exploded isometric view of an improved mounted storage device 508 in accordance with a first embodiment of the present invention is shown. The improved mounted storage device 508 includes a non-latching side bezel member 512 coupled to a longitudinal member 532a extending rearward toward a hot pluggable midplane or backplane in the drawer 212 or chassis 304. The non-latching side bezel member 512 is a stationary member 536, and does not move relative to the storage device 208. A threaded fastener 344 attaches longitudinal member 532a to a mounting hole of storage device 208.

The improved mounted storage device 508 also includes a latching side bezel member 516 coupled to a longitudinal member 532b extending rearward toward the hot pluggable midplane or backplane in the drawer 212 or chassis 304. The latching side bezel member 516 includes a finger movable member 520 coupled to a latch 524. Therefore, when the finger movable member 520 is moved toward the stationary member 536, the latch 524 is retracted within the latching side bezel member 516 and does not retain the improved mounted storage device 508 within the drawer 212 or chassis 304. Another threaded fastener 344 attaches longitudinal member 532b to another mounting hole of storage device 208.

One bezel member 512, 516 includes a latching clip 528, which engages a latching clip receiver in the other bezel member 512, 516. The latching clip 528 maintains a positive connection between the non-latching side bezel member 512 and the latching side bezel member 516, independent of the finger movable member 520.

Additionally, one bezel member 512, 516 includes alignment projections 540 which extend toward the other bezel member 512, 516 and engage cutouts 544 in the other bezel member 512, 516 to align the non-latching side bezel member 512 with the latching side bezel member 516. It should be noted that the latching clip 528, latching clip receiver, alignment projections 540, and cutouts 544 may be located on either bezel member 512, 516 as long as there is a complementary registration in the other bezel member 512, 516. That is, the latching clip 528 and latching clip receiver provide complementary registration, and the alignment projections 540 and cutouts 544 provide complementary registration.

In order to minimize manufacturing cost, longitudinal member 532a and the non-latching side bezel member 512 are a single piece of material. Similarly, longitudinal member 532b and the latching side bezel member 516 (but excluding the finger-movable member 520 and latch 524) are also a single piece of material. In the preferred embodiment, the material for both pieces is an injection molded polymer such as ABS or PCABS plastic.

Referring now to FIG. 5c, a diagram illustrating a bottom rear isometric view of an improved storage device sled in accordance with a first embodiment of the present invention is shown. The improved mounted storage device 508 includes a storage device 208 mounted within the improved storage device sled.

As described previously with reference to FIG. 5c, one of bezel members 512, 516 includes a latching clip receiver 548 which retains latching clip 528 and keeps non-latching side bezel member 512 coupled to latching side bezel member 516. The latching clip 528 is oriented in a fashion that prevents the non-latching side of bezel member 512 from being separated from the latching side of bezel member when longitudinal member 532a is parallel to longitudinal member 532b. Instead, when the distal end of longitudinal member 532a is pulled away from the distal end of longitudinal member 532b, latching clip 528 separates from latching clip receiver 548 and the non-latching side bezel member 512 may then be separated from the latching side bezel member 516.

The improved mounted storage device 508 also includes one or more tapered posts 552 on the inside of each longitudinal member 532a, 532b. The tapered posts 552 substitute for threaded fasteners 344, and reduce the number of threaded fasteners 344 and assembly time required to mount the storage device 208 in the improved storage device sled. The function and operation of the tapered posts 552 is discussed in more detail with respect to FIGS. 6a-6c. It is generally preferred, but not required, that the tapered posts 552 have a slight interference fit with the storage device mounting holes 604.

Referring now to FIG. 5d, a diagram illustrating a side view of an improved mounted storage device 508 in accordance with a first embodiment of the present invention is shown. Although longitudinal member 532b is illustrated, each of the longitudinal members 532a, 532b includes a front vertical biasing feature 560a and a rear vertical biasing feature 560b. The front vertical biasing feature 560a is formed from the same material as longitudinal members 532a, 532b and is oriented toward the front end of improved mounted storage device 508. The front vertical biasing feature 560a exerts spring force against a drawer 212 or chassis 304 surface directly above the mounted storage device 508, and therefore biases a bottom surface of the improved mounted storage device 508 against an adjacent planar surface of the drawer 212 or chassis 304. In this way, the front portion of the improved mounted storage device 508 is securely held in place within the drawer 212 or chassis 304 and is not free to move in response to shock or vibration events exposed to storage enclosure 112.

Similarly, the rear vertical biasing feature 560b is also formed from the same material as longitudinal members 532a, 532b and is oriented toward the rear of improved mounted storage device 508. The rear vertical biasing feature 560b exerts spring force against a drawer 212 or chassis 304 surface directly above the mounted storage device 508, and therefore biases a bottom surface of the improved mounted storage device 508 against an adjacent planar surface of the drawer 212 or chassis 304. In this way, the rear portion of the improved mounted storage device 508 is securely held in place within the drawer 212 or chassis 304 and is not free to move in response to shock or vibration events exposed to storage enclosure 112. At least one vertical biasing feature 560a, 560b does not exert biasing force against a chassis 304, 404 interior surface until the storage device sled is inserted at least halfway into the chassis 304, 404. Each of the front and rear vertical biasing features 560a, 560b exerts similar biasing forces against the chassis interior surface when the storage device sled is fully installed in the chassis 304, 404. In another embodiment, at least one of the front vertical biasing feature 560a or the rear vertical biasing feature 560b is located on the bottom surface of the storage device sled. In yet another embodiment, each of the top and bottom surfaces of the storage device sled includes at least one vertical biasing feature 560.

The latching side bezel member 516 includes the latch 524 as well as a horizontal biasing feature 556. In the preferred embodiment, the horizontal biasing feature 556 is formed as a step of the latch 524 and is formed from the same material as the latch 524. The latch 524 engages the matching opening 320 in order to secure the mounted storage device 508 within the drawer 212 or chassis 304. However, the horizontal biasing feature 556 does not engage the matching opening 320 and instead bears against the first chassis interior side surface 312 to bias the improved mounted storage device 508 against the second chassis interior side surface 316. In this way, the improved mounted storage device 508 does not freely move horizontally in response to shock or vibration events exposed to the storage enclosure 112.

The combination of the horizontal biasing feature 556 and front and rear vertical biasing features 560a, 560b on each of the longitudinal members 532a, 532b thus secures and locates the improved mounted storage device 508 within the drawer 212 or chassis 304, 404 and reduces susceptibility of the storage device 208 to storage enclosure 112 shock and vibration events.

Referring now to FIG. 5e, a diagram illustrating a detail view of an improved mounted storage device 508 in accordance with a first embodiment of the present invention is shown. The detail view illustrates the area around each threaded fastener 344 of each longitudinal member 532a, 532b.

Improved shock and vibration performance is achieved by altering material in proximity to each of the threaded fastener 344 holes in each longitudinal member 532a, 532b. Specifically, perforations 564 are placed approximately symmetrically around the threaded fastener 344 holes in order to reduce material stiffness at each threaded fastener 344. The perforations 564 affect shock and vibration response, and are described in more detail with respect to FIGS. 8a-9f. It should be noted that the perforations 564 may be simple holes, slotted holes as shown in FIG. 5e, S-shaped slots, or other arrangements. The reduction in stiffness is determined by the area of the perforations 564 compared to the non-perforated areas 568 the same radial distance from the threaded fastener 344 hole. The perforations 564 eliminate the need for elastomer overmold around the mounting holes 340, and since the perforations 564 may be part of a stamping or injection molding or other forming process (depending on the material) used to form longitudinal members 532a, 532b there is no need for a secondary overmold process or elastomeric bumpers which adds cost to conventional mounted storage devices 308.

Referring now to FIG. 5f, a diagram illustrating a top view of a clip and latch arrangement of an improved storage device sled in accordance with a first embodiment of the present invention is shown. The improved mounted storage device 508 includes a non-latching side bezel member 512 and a latching side bezel member 516. The latch 524 has a corresponding adjacent horizontal biasing feature 556 which does not extend as far outward as the distal end of latch 524.

The latching side bezel member 516 includes a spring 572, which exerts force between the latching side bezel member 516 and the finger movable member 520 to bias the latch 524 and horizontal biasing feature 556 against the first chassis interior side surface 312. In the preferred embodiment, the spring 572 is normally in compression, and travel limits between the finger movable member 520 in the latching side bezel member 516 prevent over compression and yield of the spring 572. In the preferred embodiment, the spring 572 has a wire diameter of 0.024 in and a spring rate of 28.3+/−2.83 lbs/in. (4.95 N/mm). When installed in the latching side bezel member 516, the spring 572 is normally compressed approximately 0.5 mm.

Referring now to FIG. 5g, a diagram illustrating a detail view 576 of a clip and latch arrangement of an improved storage device sled in accordance with a first embodiment of the present invention is shown. The latching clip 528 secures the non-latching side bezel member 512 to the latching side bezel member 516.

When the improved mounted storage device 508 is latched within a drawer 212 or chassis 304 and it is desired to remove the improved mounted storage device 508, a user or human operator moves the finger movable member 520 toward the stationary member 536. Since the finger movable member 520 is preferably formed from the same material as the latch 524 and the horizontal biasing feature 556, movement of the finger movable member 520 causes both the latch 524 and the horizontal biasing feature 5562 move in the same direction by the same amount. This in turn causes the latch 524 to disengage from the matching opening 320, thus allowing a user or human operator to pull the complete improved mounted storage device 508 from the drawer 212 or chassis 304. When the finger movable member 520 is released, the compressed spring 572 then moves the finger movable member 520 away from the stationary member 536 and the latch 524 and horizontal biasing feature 556 again extend fully outward from the latching side bezel member 516.

Referring now to FIG. 6a, a diagram illustrating a first step of an assembly sequence for an improved mounted storage device 508 in accordance with a first embodiment of the present invention is shown. Prior to assembly, the components of the improved mounted storage device 508 include a storage device 208, a non-latching side bezel member 512, a latching side bezel member 516, and two threaded fasteners 344.

In the first step of assembly, the storage device 208 is tilted upward while a first tapered post 552 engages a forward mounting hole 604 of the storage device 208. Next, the latching side of the bezel member 516 engages the storage device 208 and the non-latching side bezel member 512 at three points: at a tapered post 552 of the latching side bezel member 516 engaging a forward mounting hole 604 of the storage device 208, at alignment projections 540 engaging cutouts 544, and at the latching clip 528 engaging the latching clip receiver 548. At the conclusion of this first step, the latching side bezel member 516 will be joined to the non-latching side bezel member 512, and the front tapered posts 552 will engage front mounting holes 604 in the sides of the storage device 208.

Referring now to FIG. 6b, a diagram illustrating a second step of an assembly sequence for an improved mounted storage device 508 in accordance with a first embodiment of the present invention is shown. At the second step, the latching clip engages the latching clip receiver 612, the alignment projections engage the cutouts 616, and the storage device pivots around the tapered posts 620 such that the storage device is now coplanar with the non-latching side bezel member 512, the latching side bezel member 516, and both longitudinal members 532a, 532b.

Referring now to FIG. 6c, a diagram illustrating a third step of an assembly sequence for an improved mounted storage device 508 in accordance with a first embodiment of the present invention is shown. The final assembly step for improved mounted storage device 508 is to attach threaded fasteners 344 through each of the longitudinal members 532a, 532b. On one side, a threaded fastener 344 screws into a storage device mounting hole 624a. On the other side, a threaded fastener 344 screws into a storage device mounting hole on the opposite side 624b.

Disassembling the improved mounted storage device 508 is essentially the opposite of the steps illustrated in FIGS. 6a-6c. The only difference is in the final step corresponding to FIG. 6a. Once the storage device 208 is tilted up while pivoting around the tapered posts 552, the non-latching side bezel member 512 is separated from the latching side bezel member 516 by pulling the distal ends of the longitudinal members 532a, 532b apart. This causes the latching clip 528 to disengage from the latching clip receiver 548.

Referring now to FIG. 7a, a diagram illustrating an isometric view of an improved mounted storage device 708 in accordance with a second embodiment of the present invention is shown. The improved mounted storage device 708 is intended for use in a chassis 404 as illustrated in FIG. 4a. The front portion of the improved mounted storage device 708 is generally similar to the front portion of the conventional mounted storage device 408. However, the improved mounted storage device 708 does not include the elastomer overmold around mounting holes 424 used in the conventional mounted storage device 408. Instead, the improved mounted storage device 708 includes mounting holes with affected structural stiffness 704.

Referring now to FIG. 7b, a diagram illustrating an exploded isometric view of an improved mounted storage device 708 in accordance with a second embodiment of the present invention is shown. Unlike the improved mounted storage device 508 of the first embodiment, the improved mounted storage device 708 of the second embodiment has more threaded fasteners 344 than the conventional mounted storage device 408. Although four threaded fasteners 344 are shown, each of which engages storage device mounting holes 712 in the sides of storage device 208, it should be noted that the second embodiment could just as well have used two threaded fasteners 344 and two tapered posts 552 as the first embodiment shown in FIGS. 5a-5g.

Referring now to FIG. 7c, a diagram illustrating a side view of an improved mounted storage device 708 in accordance with a second embodiment of the present invention is shown. The improved mounted storage device 708 includes a storage device 208 mounted within an improved storage device sled. The improved mounted storage device 708 includes two threaded fasteners 344 in each longitudinal member 716a, 716b. The threaded fasteners 344 secure the improved storage device sled to the storage device 208.

Referring now to FIG. 7d, a diagram illustrating a detail view of an improved mounted storage device 708 in accordance with a second embodiment of the present invention is shown. Similar to the improved mounted storage device 508 of the first embodiment, the improved mounted storage device 708 of the second embodiment utilizes areas of reduced stiffness 704 around each of the threaded fasteners 344. Perforations 724 arranged approximately symmetrically around each threaded fastener 344 are combined with non-perforated areas 720 between the perforations to reduce material stiffness at the hole corresponding to the threaded fastener 344. The perforations 724 affect shock and vibration response, and are described in more detail with respect to FIGS. 8a-9f. It should be noted that the perforations 724 may be simple holes, slotted holes as shown in FIG. 7d, S-shaped slots, or other perforation arrangements.

Referring now to FIG. 8a, a diagram illustrating an untreated shock response in accordance with embodiments of the present invention is shown. Storage enclosures 112 may be exposed to a variety of shock events. For example, a storage enclosure 112 may be dropped, kicked, or impacted by movement of other equipment in proximity to the storage enclosure 112. When a shock event impacts a storage enclosure 112, the storage enclosure 112 structure translates components of the shock event to subassemblies, including power supplies, storage controllers 204, drawers 212, and mounted storage devices 308, 408, 508, and 708. The storage device sled of a mounted storage device 308, 408, 508, and 708 in turn translates components of the shock event to the storage device 208 itself.

Shock events are characterized by a g force level over a period of time, or shock duration 812a. Each shock event has a maximum, or peak shock level 804. After the peak shock level 804, the shock event is naturally damped by various components and assemblies of the storage enclosure 112 and decays over time. It is important to note that the peak shock level 804 delivered to a storage enclosure 112 may not be the peak shock level 804a delivered to a storage device 208, and it is most important to measure shock events at individual storage devices 208 with accelerometers or similar instrumentation. Storage devices 208 have a maximum allowed operating shock level 808 specified by the manufacturer. The maximum allowed operating shock level 808 is the level above which a storage device 208 may experience unreliable operation or even damage. Therefore, it is important to keep the peak shock level 804a presented to a storage device 208 below the maximum allowed operating shock level 808. It should be noted that some shock events may have a peak shock level 804a so high that is impossible to reduce the peak shock level 804a below the maximum allowed operating shock level 808.

Referring now to FIG. 8b, a diagram illustrating a treated shock response in accordance with embodiments of the present invention is shown. Shock event treatment seeks to reduce the peak shock level 804b experienced by the storage device 208 below the maximum allowed operating shock level 808, while increasing the shock duration 812b compared to the shock duration 812a of the untreated shock event. Altering the stiffness 504, 704 of longitudinal members 532a/532b or 716a/716b, respectively, in the area of the threaded fasteners 344 may beneficially alter the shock response illustrated in FIG. 8b.

Performance testing of storage devices 208 includes reading and writing known data patterns to the storage device 208. In general, storage devices 208 may sustain predetermined performance levels under normal conditions based on design parameters of each storage device 208. For example, a given hard disk drive storage device 208 is able to sustain a given read or write data transfer rate (in megabytes per second, or MB/s) based on many parameters, including data interface characteristics, disk rotation rate, read and write channel performance, and data caching policies.

When a shock impulse is presented to hard disk drive storage device 208 during testing, the shock impulse duration is commonly about 40 milliseconds (ms) in duration. Some shock impulses may cause host read or write errors to storage devices 208. By altering the stiffness 504. 704 of longitudinal members 532a/532b or 716a/716b, respectively, it is possible to reduce the peak shock level 804b below the maximum allowed shock level 808. When translated to shock testing, the shock impulse is reduced to a shock impulse where host read and write errors no longer occur.

The techniques of the present invention do not treat shock impulses using conventional damping techniques. Therefore, the shock impulse energy into the storage device 208 is the same before and after treatment, and the area under the shock impulse of FIG. 8a is the same as the area under the shock impulse in FIG. 8b.

Referring now to FIG. 9a, a diagram illustrating an untreated vibration response in accordance with embodiments of the present invention is shown. Mechanical vibration is provided by operating motors in proximity to a storage enclosure 112. Within a storage enclosure 112, vibration is provided by disk drive devices, tape drive devices, optical drives, and rotating fans. Outside a storage enclosure 112, vibration is typically sourced from compressors, fans, generators, and various other HVAC equipment. Unlike shock events, mechanical vibration is periodic in nature and generally constant.

Various components of a storage enclosure 112, including storage device sleds, have inherent resonant frequencies 904 depending on the material, mass, and shape of the components. Resonant frequencies 904 illustrated in FIG. 9a are identified as frequencies $f_1$, $f_2$, $f_3$, $f_4$, and $f_5$. Each of the resonant frequencies $f_1$-$f_5$ has a center vibration frequency (in Hertz, or Hz) as well as a frequency bandwidth. Additionally, each resonant frequency 904 has a corresponding g force associated with it.

Referring now to FIG. 9b, a diagram illustrating storage device 208 I/O performance over a predetermined frequency range in accordance with embodiments of the present invention is shown. Performance testing is discussed with reference to FIG. 11. In the absence of vibration, a maximum performance level 912 is maintained to storage devices 208.

While noting the resonant frequencies 904 identified in FIG. 9a, performance testing is performed to identify which of the resonant frequencies 904 produces a drop in performance below the performance threshold 916. The performance threshold 916 is a predetermined minimum performance level the system is required to support while exposed to a range of vibration frequencies. In the preferred embodiment, the performance threshold is 90% of the maximum performance level 912.

In the example of FIG. 9b, there are two resonant frequencies 904 at which performance drops below the performance threshold 916. These frequencies are known as frequencies of concern 908, and are identified as frequencies $f_3$ and $f_5$. Performance at frequencies $f_1$ and $f_4$ do not produce levels below the performance threshold 916, and therefore do not require specific treatment. Additionally, performance at resonant frequency 904 $f_2$ is unaffected and remains at the maximum performance value 912.

Referring now to FIG. 9c, a diagram illustrating a treated damped vibration response in accordance with embodiments of the conventional art is shown. Damped vibration frequencies have the characteristic of a reduced g force compared with un-damped vibration frequencies, but a greater vibration frequency bandwidth. Damped treatment generally includes use of softer or elastomeric materials such as rubber bumpers or overmolds located at mechanical coupling points between assemblies. For example the elastomer overmold around mounting holes 340, 424 illustrated in FIGS. 3c and 4b, respectively, would provide a damped vibration frequency response. Even with a damped treatment, one or more vibration frequencies 924 may exceed a g force threshold 920. The g force threshold 920 corresponds to a level above which performance degradation by the storage device 208 may be observed.

Referring now to FIG. 9d, a diagram illustrating a treated vibration response by reducing response frequencies in accordance with embodiments of the present invention is shown. As discussed previously, damped treatments increase costs by requiring additional components and secondary manufacturing operations to add elastomeric materials to rigid components.

The present invention seeks to mitigate storage device 208 performance problems due to vibration frequencies by lowering the effective resonant frequencies that may cause performance problems. This is achieved by altering the stiffness 504, 704 of longitudinal members 532a/532b or 716a/716b, respectively, in proximity to the holes where threaded fasteners 344 are located. The stiffness may be altered by either increasing the stiffness or by lowering the stiffness. Stiffness may be increased by increasing the thickness of the material in proximity to the threaded fastener 344 mounting holes or by substituting a stiffer material for the longitudinal members 532a/532b or 716a/716b. Stiffness may be reduced by substituting a less stiff material for the longitudinal members 532a/532b or 716a/716b, or by relieving or perforating the material 504, 704 in proximity to mounting holes used for the threaded fasteners 344. Substituting a less stiff material may be undesirable due to wear or cost considerations. However, relieving or perforating the material often comes at little to no cost impact since relieving/perforating the material may be easily integrated into injection molds used for polymers or stamping/drilling operations suitable for use with metal materials. The effect of reducing stiffness 344 in proximity to threaded fastener 344 mounting holes is illustrated in FIG. 9d, where the response near the frequencies of concern 928 are reduced below the g force threshold 920.

Referring now to FIG. 9e, a post-treatment I/O performance response according to embodiments of the present invention is shown. The I/O performance response shown in FIG. 9e is the desired post-treatment response, in which no dips below the performance threshold 916 are observed across the tested frequency range. Most commonly, the dips that still exist have center frequencies slightly lower than the resonant frequencies 904 due to reducing the material stiffness 504, 704 in proximity to the threaded fasteners 344.

Referring now to FIG. 9f, an illustration of insufficient correction of I/O performance according to embodiments of the present invention is shown. Once testing has identified the frequencies of concern 908 as shown in FIG. 9b, the material stiffness 504, 704 in proximity to the threaded fasteners 344 is reduced. After reducing the material stiffness, the mounted storage device 508, 708 is retested according to the test configuration described with respect to FIG. 11.

If retesting reveals one or more dips below the performance threshold 916, additional treatment is required. In the preferred embodiment, the material stiffness in proximity to the storage device sled mounting holes 504, 704 is again reduced. Subsequent stiffness reduction corresponding to dip 932 compared with the untreated dip shown in FIG. 9b should be used to guide the amount of material relieved. After further reducing the material stiffness, the mounted storage device 508, 708 is retested again until the response resembles the response shown and described in FIG. 9e. If further reduction of material stiffness is not possible or practical, then either conventional damping techniques using elastomeric materials or a change in storage device sled materials or thicknesses may be required.

Referring now to FIG. 10, a block diagram illustrating a resonant frequency 904 determination configuration in accordance with embodiments of the present invention is shown. Different types, brands, and sizes of storage devices 208 have different resonant frequencies 904. In order to empirically determine the resonant frequencies 904 for a specific storage device 208, it is necessary to instrument a storage device 208 and observe the response to a vibration profile presented to the storage device 208.

A swept sine wave generator 1004 generates a swept sine wave 1008 over a frequency range determined by the operator. Because low frequencies are often resonant frequencies, in most cases the lower limit of the swept sine wave 1008 should be 0 Hz, or DC. The upper range of vibration frequencies for the swept sine wave 1008 depends on the characteristics of the individual storage device 208. With current hard disk drive technology, approximately 5 kHz is a reasonable upper frequency for the swept sine wave 1008. However, with track densities increasing every year it should be expected to have upper frequency limits at 10 kHz or even 20 kHz or more.

Storage device 208 is instrumented with an accelerometer 1012 or other device that reports g forces that may be graphically observed or recorded. Accelerometer 1012 provides accelerometer data 1016 to a display terminal or computer 1020. The result of the resonant frequency 904 determination testing will be a graph approximately similar to that which is illustrated in FIG. 9a. The graph will identify where the resonant frequencies 904 of the storage device 208 are, and which frequencies are likely to be frequencies of concern 908.

Referring now to FIG. 11, a block diagram illustrating a shock and vibration evaluation configuration in accordance with embodiments of the present invention is shown. Shock and vibration testing is independently conducted to the storage enclosure 112, and most of the configuration is the same for either shock or vibration testing.

Storage enclosure 112 includes one or more mounted storage devices 308, 408, 508, 708, and an accelerometer 1012 is placed on the specific storage device 208 under test. A computer running a performance test or I/O profiling application 1112 is connected to the storage enclosure 112 through a standard I/O interface that handles read and write requests to the mounted storage devices 308, 408, 508, 708. The I/O profiling software application 1112 generates read and write I/O requests 1116 to individually addressed storage devices 208.

The accelerometer 1012 provides accelerometer data 1016 to a display terminal or computer 1020. In general, the accelerometer data 1016 includes g forces the storage device 208 under test is exposed to. The display terminal or computer 1020 provides a graphical illustration of the accelerometer data 1016 as either the g force profile and the duration of a shock impulse 1108, or the g force profile over a range of vibration frequencies provided by a swept sine wave 1008. In some embodiments, the display terminal or computer 1020 is the same computer running the I/O profiling application 1112. In other embodiments, the display terminal or computer 1020 is a different computer from the computer running the I/O profiling application 1112.

For vibration measurements, a swept sine wave generator 1004 provides a swept sine wave 1008 to the storage enclosure 112. The storage enclosure 112 translates the swept sine wave 1008 into a specific vibration profile detected by the accelerometer 1012. It has been found that for current storage devices 208, a minimum vibration testing range of 100 Hz. to 500 Hz. should be used since the most serious resonant frequency 904 problems occur within that range. In other embodiments, the predetermined range of frequencies may extend above or below 5 kHz. For shock measurements, a shock impulse generator 1104 generates a shock impulse 1108 to the storage enclosure 112. The storage enclosure 112 then translates the shock impulse 1108 into a specific shock profile detected by the accelerometer 1012 at the storage device 208.

Referring now to FIG. 12, a flowchart illustrating a storage device 208 shock optimization process in accordance with the preferred embodiment of the present invention is shown. Flow begins at block 1204.

At block 1204, a shock impulse generator 1104 is connected to the storage enclosure 112. The shock impulse generator 1104 creates shock impulses 1108 and delivers them to the storage enclosure 112. The shock impulses 1108 have a predetermined g force 804a and duration 812a. Flow continues to block 1208.

At block 1208, a computer running in I/O profiling application 1112 is connected to the storage enclosure 112. The computer 1112 is connected through an I/O interface to the storage enclosure 112, where the I/O interface supports a data protocol supported by both the computer 1112 and the storage enclosure 112. The computer 1112 includes a profiling software application that generates I/O requests 1116 and measures response time or throughput of the I/O requests. The I/O requests include read and write requests 1116. In some embodiments, the protocol used for the I/O requests 1116 is a block level protocol such as SCSI. In other embodiments the protocol used for the I/O requests 1116 is a file level protocol. Flow continues to block 1212.

At block 1212, the computer 1112 runs the profiling software application which generates I/O requests 1116 to a selected storage device 208. The computer 1112 measures and records response time and throughput to the I/O requests 1116. Flow continues to block 1216.

At block 1216, the shock impulse generator 1104 generates predetermined shock impulses 1108 to the storage enclosure 112. An accelerometer 1012 or other device able to measure shock g forces is attached to the storage device 208 under test. While the shock impulses 1108 are being presented to the storage enclosure 112, the profiling software application 1112 identifies the shock events and duration, including where there is a drop of more than a predetermined percentage in I/O performance. Flow proceeds to decision block 1220.

At decision block 1220, if there is a drop of more than the predetermined percentage in I/O performance, flow proceeds to block 1224. If there is not a drop of more than the predetermined percentage in I/O performance 820, then the administered shock profile is not affecting I/O performance more than a predetermined percentage 820, and flow instead proceeds to decision block 1228.

At block 1224, the mounting members (longitudinal members 532a/532b or 716a/716b) are modified in order to reduce stiffness. In the preferred embodiment, the stiffness is initially reduced by 50% by perforating 504, 704 an area around the threaded fasteners 344 mounting holes. It has been found that an initial 50% reduction in stiffness is large enough to produce a meaningful change in performance loss without significantly altering the structural rigidity of the mounting members 532a/532b or 716a/716b. After the stiffness is initially reduced by 50%, each time block 1224 is executed, in the preferred embodiment the stiffness is reduced by an additional 10% from what it had previously been. In other embodiments, the initial stiffness reduction may be less than 50%, and subsequent stiffness reduction may be less than or more than 10% additional. Flow proceeds to block 1216 to retest the storage device with the new mounting member 532a/532b or 716a/716b altered stiffness.

At decision block 1228, if there are more untested storage devices 208 in the storage enclosure 112 and it is desirable to test the untested storage devices 208, flow proceeds to block 1232. If there are not more untested storage devices 208 in the storage enclosure 112, or it is not desirable to test the untested storage devices 208, then flow ends.

At block 1232, a next untested storage device 208 is selected. An accelerometer 1012 or appropriate shock instrumentation is attached to the next untested storage device 208. The profiling software application running on the computer 1112 is modified to address the next untested storage device 208. Flow proceeds to block 1212 to run the I/O profiling software 1112 to generate I/O requests 1116 to the selected storage device 208.

Referring now to FIG. 13, a flowchart illustrating a storage device 208 vibration optimization process in accordance with the preferred embodiment of the present invention is shown. Flow begins at block 1304.

At block 1304, the frequency or frequencies of concern 908 are determined. The frequency or frequencies of concern 908 are those frequencies where there is a drop of more than a predetermined percentage in I/O performance 820 of a storage device 208 within the range of a swept sine wave 1008 presented to the storage enclosure 112. The determination process for the frequency or frequencies of concern 908 is illustrated in more detail in FIG. 14. Flow proceeds to block 1308.

At block 1308, the resonant frequencies 904 for the storage devices 208 to be tested are determined. In one embodiment, the manufacturer of the storage devices 208 provides the resonant frequency 904 information. If the manufacturer is unable to provide the resonant frequency 904 information, the resonant frequencies 904 are determined empirically by the process illustrated in FIG. 15. The resonant frequencies 904 will validate where the frequencies of concern 908 are, and provides explanations for the frequencies of concern 908 determined in block 1304. Flow proceeds to decision block 1312.

At decision block 1312, the frequencies of concern 908 are compared to the resonant frequencies 904. If none of the frequencies of concern 908 correspond to a resonant frequency 904, then altering the stiffness of a mounting member 532a/532b or 716a/716b will not affect the frequencies of concern 908 since the loss of performance at those frequencies 908 is not due to a resonant frequency 904 for the storage device 208 under test. Therefore, if none of the frequencies of concern 908 correspond to a resonant frequency 904, then flow ends. However, if at least one of the frequencies of concern 908 corresponds to a resonant frequency 904, then altering the stiffness of a mounting member 532a/532b or 716a/716b will affect at least one frequency of concern 908. In that case, flow proceeds to block 1316.

At block 1316, the mounting members (longitudinal members 532a/532b or 716a/716b) are modified in order to reduce performance loss at the frequencies of concern 908. Performance loss is reduced by reducing the stiffness of the mounting members 532a/532b or 716a/716b. In the preferred embodiment, the stiffness is initially reduced by 50% by perforating area around the threaded fasteners 344 mounting holes. It has been found that an initial 50% reduction in stiffness is large enough to produce a meaningful change in performance loss without significantly altering the structural rigidity of the mounting members 532a/532b or 716a/716b. After the stiffness is initially reduced by 50%, each time block 1224 is executed, in the preferred embodiment the stiffness is reduced by an additional 10% from what it had previously been. In other embodiments, the initial stiffness reduction may be less than 50%, and subsequent stiffness reduction may be less than or more than 10% additional. Flow proceeds to decision block 1320.

At decision block 1320, if the initial test or a retest is successful (i.e. no frequencies of concern 908), then flow proceeds to block 1324. If the initial test or a retest is not successful (i.e. at least one frequency of concern 908 remains), then flow proceeds to block 1316 to again modify the mounting members 532a/532b or 716a/716b and initiate a retest.

At block 1324, the test to the selected storage device 208 is successful. Other storage devices 208 are tested in order to verify reliable operation. Flow proceeds to decision block 1328.

At decision block 1328, if there are problems with the other storage devices 208, then flow proceeds to block 1304 to reinitiate testing. If there are not problems with the other storage devices 208, then flow ends.

Referring now to FIG. 14, a flowchart illustrating a process to determine a frequency or frequencies of concern 908 for a storage device 208 in accordance with the preferred embodiment of the present invention is shown. The process illustrated in FIG. 14 details the steps required to empirically determine the frequency or frequencies of concern 908 at block 1304 of FIG. 13. Flow begins at block 1404.

At block 1404, a swept sine wave generator 1004 is connected to the storage enclosure 112. The swept sine wave generator 1004 imparts a sine wave vibration 1008 to the storage enclosure 112 across a predetermined range of frequencies. In the preferred embodiment, the predetermined range of frequencies is a DC to 5 kHz. It has been found that for current storage devices 208, a minimum vibration testing range of 100 Hz. to 500 Hz. should be used since the most serious resonant frequency 904 problems occur within that range. In other embodiments, the predetermined range of frequencies may extend above or below 5 kHz. However, it should be noted that newer generations of hard disk drives, for example, have a much higher track density than previous generations of hard disk drives. Therefore, higher vibration frequencies may have increasing effect in inducing off-track read or write failures. It is therefore expected that the upper range of vibration frequencies will increase significantly over future generations of storage devices 208. Flow proceeds to block 1408.

At block 1408, a computer 1112 is connected to the storage enclosure 112. The computer 1112 is connected through an I/O interface to the storage enclosure 112, where the I/O interface supports a protocol supported by both the computer 1112 and the storage enclosure 112. The computer 1112 includes a profiling software application that generates I/O requests and measures response time or throughput of the I/O requests. The I/O requests include read and write requests 1116. In some embodiments, protocol is a block level protocol such as SCSI. In other embodiments the protocol is a file level protocol. Flow continues to block 1412.

At block 1412, the computer 1112 runs the profiling software application which generates I/O requests 1116 to a selected storage device 208. The computer 1112 measures and records response time and throughput to the I/O requests 1116. Flow continues to block 1416.

At block 1416, the swept sine wave generator 1104 generates a predetermined vibration profile 1008 to the storage enclosure 112 across a range of frequencies. An accelerometer 1012 or other device able to measure shock g forces is attached to the storage device 208 under test. While the vibration profile 1008 is being presented to the storage enclosure 112, the profiling software application records the I/O performance, including where there is a drop of more than a predetermined percentage in I/O performance 820. Flow proceeds to decision block 1420.

At decision block 1420, if there are more untested storage devices 208 in the storage enclosure 112, then flow proceeds to block 1424. If there are not more untested storage devices 208 in the storage enclosure 112, then flow ends.

At block 1424, a next untested storage device 208 is selected. An accelerometer 1012 or appropriate vibration instrumentation is attached to the next untested storage device 208. The profiling software application running on the computer 1112 is modified to address the next untested storage device 208. Flow proceeds to block 1412 to run the I/O profiling software to generate I/O requests 1116 to the next selected storage device 208.

Referring now to FIG. 15, a flowchart illustrating a process to establish resonant frequencies 904 of storage devices 208 in accordance with the preferred embodiment of the present invention is shown. The process of FIG. 15 corresponds to block 1308 of FIG. 13, and utilizes the block diagram of the resonant frequency determination configuration illustrated in FIG. 10.

At block 1504, a swept sine wave generator 1004 is connected to the storage device 208. The swept sine wave generator 1004 generates a swept sine wave 1008 as vibration frequencies to the storage device 208. Flow proceeds to block 1508.

At block 1508, an accelerometer 1012 is connected to the storage device 208. The accelerometer 1012 measures g forces imparted by the swept sine wave generator 1004. Flow proceeds to block 1512.

At block 1512, while altering the swept sine wave 1008 to the storage device 208, accelerometer data 1016 is presented to a display terminal or computer 1020. Thus, the display terminal or computer 1020 displays the g forces seen by the storage device 208 across the vibration frequencies 1008. Flow proceeds to block 1512.

At block 1516, the resonant frequencies 904 are those frequencies where the accelerometer g force 1016 exceeds the input g force 1008 from the swept sine wave generator 1004. Flow ends at block 1516.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

We claim:

1. A self-biasing storage device sled for mounting a storage device within a chassis, comprising:
    a bezel forming a front surface of the storage device sled, comprising:
        a first portion that is stationary relative to a storage device mounted within the storage device sled;
        a second portion vertically captured within the first portion and configured to slide transversely between an unlatching and a latching position, comprising:
            a finger-movable member;
            a latch, configured to engage a matching opening in a first chassis interior side surface when the storage device sled is installed in the chassis; and
            a horizontal biasing feature adjacent to the latch and configured to move in concert with the latch; and
        a spring retained between the bezel first and second portions and configured to push the latch outwardly from the bezel,
    wherein when the storage device is mounted to the storage device sled and installed in the chassis, the horizontal biasing feature exerts force against the first chassis interior side surface and biases the storage device sled against a second chassis interior side surface, wherein the second chassis interior side surface is on an opposite side of the storage device from the first chassis interior side surface.

2. The self-biasing storage device sled of claim 1, wherein the latch protrudes outwardly from the first portion of the bezel more than the horizontal biasing feature.

3. The self-biasing storage device sled of claim 2, wherein the first portion of the bezel limits the transverse travel of the second portion, wherein when the second portion is moved to the latching position the latch and the horizontal biasing feature extend outward from the first portion, wherein when the second portion is moved to the unlatching position the latch and the horizontal biasing feature are within the first portion and do not extend outward from the first portion.

4. The self-biasing storage device sled of claim 2, wherein the finger-movable member, the latch, and the horizontal biasing feature are formed from the same piece of material.

5. The self-biasing storage device sled of claim 2, wherein the spring is always in compression, wherein the travel limits between the first and second portions prevent over-compression and yield of the spring.

6. A method for removing a self-biasing storage device sled from a chassis, comprising:
    moving, by a finger, a finger-movable member of a second portion of a storage device sled bezel horizontally toward the center of a first portion of the storage device sled bezel, wherein the second portion is vertically captured within the first portion and is configured to slide transversely between an unlatching and a latching position, the second portion comprising:
        a latch, configured to engage a matching opening in a first chassis interior side surface when the storage device sled is installed in the chassis; and
        a horizontal biasing feature adjacent to the latch and configured to move in concert with the latch, the horizontal biasing feature exerting force against the first chassis interior side surface and biasing the storage device sled against a second chassis interior side surface;
    unloading, by the second portion, the horizontal biasing feature away from the first interior side surface of the chassis, wherein the horizontal biasing feature does not exert force against chassis interior side surfaces when unloaded;
    unlatching, by the second portion, the latch from the matching opening in the first chassis interior side surface; and
    pulling the storage device sled from the chassis.

7. The method for removing a self-biasing storage device sled of claim 6, wherein the latch protrudes outwardly from the bezel more than the horizontal biasing feature.

8. The method for removing a self-biasing storage device sled of claim 7, wherein the first portion of the bezel limits transverse movement of the second portion, wherein when the second portion is moved to the latching position the latch and the horizontal biasing feature extend outward from the first portion, wherein when the second portion is moved to the unlatching position the latch and the horizontal biasing feature are within the first portion and do not extend outward from the first portion.

9. The method for removing a self-biasing storage device sled of claim 7, wherein the finger-movable member, the latch, and the horizontal biasing feature are formed from the same piece of material.

10. The method for removing a self-biasing storage device sled of claim 7, wherein the storage device sled comprises a spring coupled between the bezel first and second portions and configured to push the latch outwardly from the bezel.

11. The method for removing a self-biasing storage device sled of claim 8, wherein the spring is always in compression, wherein the travel limits between the first and second portion prevent over-compression and yield of the spring.

* * * * *